(12) United States Patent
Kadota et al.

(10) Patent No.: US 11,356,075 B2
(45) Date of Patent: Jun. 7, 2022

(54) SURFACE ACOUSTIC WAVE DEVICE HAVING MASS-LOADED ELECTRODE

(71) Applicants: TOHOKU UNIVERSITY, Sendai (JP); SKYWORKS SOLUTIONS, INC., Irvine, CA (US)

(72) Inventors: Michio Kadota, Sendai (JP); Shuji Tanaka, Sendai (JP); Hiroyuki Nakamura, Kadoma (JP)

(*) Notice: Subject to any disclaimer, the term of this patent is extended or adjusted under 35 U.S.C. 154(b) by 0 days.

(21) Appl. No.: 17/021,125

(22) Filed: Sep. 15, 2020

(65) Prior Publication Data
US 2021/0083645 A1 Mar. 18, 2021

Related U.S. Application Data

(60) Provisional application No. 62/901,202, filed on Sep. 16, 2019.

(51) Int. Cl.
*H03H 9/02* (2006.01)
*H03H 3/08* (2006.01)
(Continued)

(52) U.S. Cl.
CPC .......... *H03H 9/02551* (2013.01); *H03H 3/08* (2013.01); *H03H 9/14541* (2013.01); *H03H 9/6406* (2013.01)

(58) Field of Classification Search
CPC .. H03H 9/02551; H03H 3/08; H03H 9/14541; H03H 9/6406; H03H 9/14538; H03H 9/02574; H03H 9/02559
(Continued)

(56) References Cited

U.S. PATENT DOCUMENTS

2004/0135650 A1* 7/2004 Miura ................ H03H 9/02834
333/133
2013/0285768 A1* 10/2013 Watanabe ................ H03H 3/02
333/193
(Continued)

FOREIGN PATENT DOCUMENTS

| KR | 10-2011-0033521 A | 3/2011 |
|---|---|---|
| TW | 109131865 | 9/2020 |
| WO | PCT/US2020/050821 | 9/2020 |

OTHER PUBLICATIONS

International Search Report dated Jan. 15, 2021 for PCT/US2020/050821.
Written Opinion dated Jan. 15, 2021 for PCT/US2020/050821.

*Primary Examiner* — Rakesh B Patel
*Assistant Examiner* — Jorge L Salazar, Jr.
(74) *Attorney, Agent, or Firm* — Chang & Hale LLP

(57) ABSTRACT

Surface acoustic wave device having mass-loaded electrode. In some embodiments, a surface acoustic wave device for providing resonance of a surface acoustic wave having a wavelength λ can include a quartz substrate and a piezoelectric plate formed from $LiTaO_3$ or $LiNbO_3$ disposed over the quartz substrate. The piezoelectric plate can have a thickness greater than 2λ. The surface acoustic wave device can further include an interdigital transducer electrode formed over the piezoelectric plate. The interdigital transducer electrode can have a mass density ρ in a range 1.50 g/cm³<ρ≤6.00 g/cm³, 6.00 g/cm³<ρ≤12.0 g/cm³, or 12.0 g/cm³<ρ≤23.0 g/cm³, and a thickness greater than 0.148λ, greater than 0.079λ, or greater than 0.036λ, respectively.

20 Claims, 19 Drawing Sheets

(51) Int. Cl.
*H03H 9/64* (2006.01)
*H03H 9/145* (2006.01)

(58) Field of Classification Search
USPC .......................................... 333/133, 193–196
See application file for complete search history.

(56) References Cited

U.S. PATENT DOCUMENTS

| | | |
|---|---|---|
| 2016/0261248 A1 | 9/2016 | Grousset et al. |
| 2018/0102760 A1 | 4/2018 | Inoue et al. |
| 2019/0074819 A1 | 3/2019 | Goto et al. |
| 2019/0253035 A1 | 8/2019 | Yamanouchi |

* cited by examiner

SURFACE ACOUSTIC WAVE DEVICE HAVING MASS-LOADED ELECTRODE

CROSS-REFERENCE TO RELATED APPLICATION(S)

This application claims priority to U.S. Provisional Application No. 62/901,202 filed Sep. 16, 2019, entitled SURFACE ACOUSTIC WAVE DEVICE HAVING MASS-LOADED ELECTRODE, the disclosure of which is hereby expressly incorporated by reference herein in its entirety.

BACKGROUND

Field

The present disclosure relates to acoustic wave devices such as surface acoustic wave (SAW) devices.

Description of the Related Art

A surface acoustic wave (SAW) resonator typically includes an interdigital transducer (IDT) electrode implemented on a surface of a piezoelectric layer. Such an electrode includes two interdigitized sets of fingers, and in such a configuration, the distance between two neighboring fingers of the same set is approximately the same as the wavelength $\lambda$ of a surface acoustic wave supported by the IDT electrode.

In many applications, the foregoing SAW resonator can be utilized as a radio-frequency (RF) filter based on the wavelength $\lambda$. Such a filter can provide a number of desirable features.

SUMMARY

In accordance with some implementations, the present disclosure relates to a surface acoustic wave device for providing resonance of a surface acoustic wave having a wavelength $\lambda$. The surface acoustic wave device includes a quartz substrate and a piezoelectric plate formed from LiTaO$_3$ or LiNbO$_3$ and disposed over the quartz substrate. The piezoelectric plate has a thickness greater than $2\lambda$. The surface acoustic wave device further includes an interdigital transducer electrode formed over the piezoelectric plate. The interdigital transducer electrode has a mass density $\rho$ in a range 1.50 g/cm$^3$<$\rho \le$6.00 g/cm$^3$, 6.00 g/cm$^3$<$\rho \le$12.0 g/cm$^3$, or 12.0 g/cm$^3$<$\rho \le$23.0 g/cm$^3$, and a thickness greater than 0.148$\lambda$, greater than 0.079$\lambda$, or greater than 0.036$\lambda$, respectively.

In some embodiments, the interdigital transducer electrode can have a metallization ratio (MR) of approximately 0.5, where MR=F/(F+G), with the quantity F being a width of an electrode finger and the quantity G being a gap dimension between two electrode fingers. In some embodiments, the interdigital transducer electrode can include aluminum, titanium, magnesium, copper, nickel, silver, molybdenum, gold, platinum, tungsten, tantalum, hafnium, other metal, an alloy formed from a plurality of metals, or a structure having a plurality of layers, with a mass density range 1.50 g/cm$^3$<$\rho \le$23.0 g/cm$^3$.

In some embodiments, the piezoelectric plate can be a LiTaO$_3$ (LT) plate. The LT plate can be configured with Euler angles of (0−/+5°, 80 to 155°, 0/+5), (90−/+5°, 90°−/+5°, 0 to 180°), or orientation angles equivalent thereto.

In some embodiments, the piezoelectric plate can be a LiNbO$_3$ (LN) plate. The LN plate can be configured with Euler angles of (0−/+5°, 60 to 160°, 0−+5), (90−/+5°, 90°−/+5°, 0 to 180°), or orientation angles equivalent thereto.

In some embodiments, the quartz substrate can be configured with Euler angles of (0+/−5°, $\theta$, 35°+/−8°), (10°+/−±5°, $\theta$, 42°+/−8°), (20°+/−5°, $\theta$, 50°+/−8°), (0°+/−5°, $\theta$, 0+/−50), (10°+/−5°, $\theta$, 0+/−50), (20°+/−5°, $\theta$, 0+/−50), (0°+/−5°, $\theta$, 90°+/−5°), (10°+/−5°, $\theta$, 90°+/−5°), (20°+/−5°, $\theta$, 90°+/−5°), (90°+/−5°, 90°+/−5°, $\psi$), or orientation angles equivalent thereto, where each of $\theta$ and $\psi$ has a value in a range 0 to 180°.

In some implementations, the present disclosure relates to a method for manufacturing a surface acoustic wave device that provides resonance of a surface acoustic wave having a wavelength $\lambda$. The method includes forming or providing a quartz substrate, and implementing a piezoelectric plate formed from LiTaO$_3$ or LiNbO$_3$ to be over the quartz substrate, such that the piezoelectric plate has a thickness greater than $2\lambda$. The method further includes forming an interdigital transducer electrode over the piezoelectric plate, such that the interdigital transducer electrode has a mass density $\rho$ in a range 1.50 g/cm$^3$<$\rho \le$6.00 g/cm$^3$, 6.00 g/cm$^3$<$\rho \le$12.0 g/cm$^3$, or 12.0 g/cm$^3$<$\rho \le$23.0 g/cm$^3$, and a thickness greater than 0.148$\lambda$, greater than 0.079$\lambda$, or greater than 0.036$\lambda$, respectively.

In some embodiments, the implementing of the piezoelectric plate can include forming or providing an assembly of a relatively thick piezoelectric plate and a quartz plate. The implementing of the piezoelectric plate can further include performing a thinning process on the relatively thick piezoelectric plate to provide the piezoelectric plate with the thickness greater than $2\lambda$, such that the piezoelectric plate includes a first surface that engages with the quartz plate and a second surface, opposite from the first surface, resulting from the thinning process.

In some embodiments, the thinning process can include a polishing process. In some embodiments, the forming of the interdigital transducer electrode over the piezoelectric plate can include forming the interdigital transducer electrode on the second surface of the piezoelectric plate. In some embodiments, the quartz plate of the assembly can be substantially the same as the quartz substrate.

In some embodiments, the implementing of the piezoelectric plate can include forming or providing an assembly of a relatively thick piezoelectric plate and a handling substrate. The implementing of the piezoelectric plate can further include performing a thinning process on the relatively thick piezoelectric plate to provide a thinned piezoelectric plate with a thickness greater than $2\lambda$, such that the thinned piezoelectric plate includes a first surface resulting from the thinning process and a second surface, opposite from the first surface, that engages the handling substrate. The thinning process can include, for example, a polishing process.

In some embodiments, the implementing of the piezoelectric plate can further include attaching a quartz plate to the first surface of the thinned piezoelectric plate. The implementing of the piezoelectric plate can further include removing the handling substrate to expose the second surface of the thinned piezoelectric plate. The removing of the handling substrate can include, for example, an etching process.

In some embodiments, the forming of the interdigital transducer electrode over the piezoelectric plate can include forming the interdigital transducer electrode on the exposed second surface of the piezoelectric plate. In some embodiments, the quartz plate attached to the first surface of the piezoelectric plate can be substantially the same as the quartz substrate.

In a number of implementations, the present disclosure relates to a radio-frequency filter that includes an input node for receiving a signal and an output node for providing a filtered signal. The radio-frequency filter further includes a surface acoustic wave implemented to be electrically between the input node and the output node. The surface acoustic wave device is configured to provide resonance of a surface acoustic wave having a wavelength $\lambda$, and includes a quartz substrate and a piezoelectric plate formed from LiTaO$_3$ or LiNbO$_3$ and disposed over the quartz substrate. The piezoelectric plate has a thickness greater than $2\lambda$. The surface acoustic wave device further includes an interdigital transducer electrode formed over the piezoelectric plate. The interdigital transducer electrode has a mass density $\rho$ in a range 1.50 g/cm$^3$<$\rho\le$6.00 g/cm$^3$, 6.00 g/cm$^3$<$\rho\le$12.0 g/cm$^3$, or 12.0 g/cm$^3$<$\rho\le$23.0 g/cm$^3$, and a thickness greater than 0.148$\lambda$, greater than 0.079$\lambda$, or greater than 0.036$\lambda$, respectively.

According to a number of implementations, the present disclosure relates to a radio-frequency module that includes a packaging substrate configured to receive a plurality of components, and a radio-frequency circuit implemented on the packaging substrate and configured to support either or both of transmission and reception of signals. The radio-frequency module further includes a radio-frequency filter configured to provide filtering for at least some of the signals. The radio-frequency filter includes a surface acoustic wave device configured to provide resonance of a surface acoustic wave having a wavelength $\lambda$ and including a quartz substrate and a piezoelectric plate formed from LiTaO$_3$ or LiNbO$_3$ and disposed over the quartz substrate. The piezoelectric plate has a thickness greater than $2\lambda$. The surface acoustic wave device further includes an interdigital transducer electrode formed over the piezoelectric plate. The interdigital transducer electrode has a mass density $\rho$ in a range 1.50 g/cm$^3$<$\rho\le$6.00 g/cm$^3$, 6.00 g/cm$^3$<$\rho\le$12.0 g/cm$^3$, or 12.0 g/cm$^3$<$\rho\le$23.0 g/cm$^3$, and a thickness greater than 0.148$\lambda$, greater than 0.079$\lambda$, or greater than 0.036$\lambda$, respectively.

In some teachings, the present disclosure relates to a wireless device that includes a transceiver, an antenna, and a wireless system implemented to be electrically between the transceiver and the antenna. The wireless system includes a filter configured to provide filtering functionality for the wireless system. The filter includes a surface acoustic wave device configured to provide resonance of a surface acoustic wave having a wavelength $\lambda$ and including a quartz substrate and a piezoelectric plate formed from LiTaO$_3$ or LiNbO$_3$ and disposed over the quartz substrate. The piezoelectric plate has a thickness greater than $2\lambda$. The surface acoustic wave device further includes an interdigital transducer electrode formed over the piezoelectric plate. The interdigital transducer electrode has a mass density $\rho$ in a range 1.50 g/cm$^3$<$\rho\le$6.00 g/cm$^3$, 6.00 g/cm$^3$<$\rho\le$12.0 g/cm$^3$, or 12.0 g/cm$^3$<$\rho\le$23.0 g/cm$^3$, and a thickness greater than 0.148$\lambda$, greater than 0.079$\lambda$, or greater than 0.036$\lambda$, respectively.

According to some implementations, the present disclosure relates to a surface acoustic wave device for providing resonance of a surface acoustic wave having a wavelength $\lambda$. The surface acoustic wave device includes a quartz substrate and a piezoelectric plate formed from LiTaO$_3$ or LiNbO$_3$ and disposed over the quartz substrate. The piezoelectric plate has a thickness greater than $2\lambda$. The surface acoustic wave device further includes an interdigital transducer electrode formed over the piezoelectric plate. The interdigital transducer electrode has a mass density $\rho$ and a thickness T greater than $$T_{threshold} = \left(\frac{0.5}{MR}\right)\left[a - b\left(1 - e^{-\rho/c}\right)\right],$$

with the quantity MR being a metallization ratio of the interdigital transducer electrode, the quantity a having a value of 0.19091$\lambda\pm\delta_a$, the quantity b having a value of 0.17658$\lambda\pm\delta_b$, and the quantity c having a value of 9.08282 g/cm$^3\pm\delta_c$.

In some embodiments, the metallization ratio (MR) of the interdigital transducer electrode can be estimated as F/(F+G), with the quantity F being a width of an electrode finger and the quantity G being a gap dimension between two electrode fingers. In some embodiments, the metallization ratio (MR) can have a value of approximately 0.5.

In some embodiments, the quantity $\delta_a$ can have a value of (0.10)0.19091$\lambda$, (0.09)0.19091$\lambda$, (0.08)0.19091$\lambda$, (0.07)0.19091$\lambda$, (0.06)0.19091$\lambda$, (0.05)0.19091$\lambda$, (0.04)0.19091$\lambda$, (0.03)0.19091$\lambda$, (0.02)0.19091$\lambda$, (0.01)0.19091$\lambda$, or approximately zero. In some embodiments, the quantity $\delta_b$ can have a value of (0.10)0.17658$\lambda$, (0.09)0.17658$\lambda$, (0.08)0.17658$\lambda$, (0.07)0.17658$\lambda$, (0.06)0.17658$\lambda$, (0.05)0.17658$\lambda$, (0.04)0.17658$\lambda$, (0.03)0.17658$\lambda$, (0.02)0.17658$\lambda$, (0.01)0.17658$\lambda$, or approximately zero. In some embodiments, the quantity $\delta_c$ can have a value of (0.10)9.08282 g/cm$^3$, (0.09)9.08282 g/cm$^3$, (0.08)9.08282 g/cm$^3$, (0.07)9.08282 g/cm$^3$, (0.06)9.08282 g/cm$^3$, (0.05)9.08282 g/cm$^3$, (0.04)9.08282 g/cm$^3$, (0.03)9.08282 g/cm$^3$, (0.02)9.08282 g/cm$^3$, (0.01)9.08282 g/cm$^3$, or approximately zero.

In some embodiments, the piezoelectric plate can be a LiTaO$_3$ (LT) plate. In some embodiments, the LT plate can be configured with Euler angles of (0-/+5°, 80 to 155°, 0-/+5°), (90-/+5°, 90°-/+5°, 0 to 180°), or orientation angles equivalent thereto.

In some embodiments, the piezoelectric plate can be a LiNbO$_3$ (LN) plate. The LN plate can be configured with Euler angles of (0-/+5°, 60 to 160°, 0/+5), (90-/+5°, 90°-/+5°, 0 to 180°), or orientation angles equivalent thereto.

In some embodiments, the quartz substrate can be configured with Euler angles of (0+/-5°, $\theta$, 35°+/-8°), (10°+/-±5°, $\theta$, 42°+/-8°), (20°+/-5°, $\theta$, 50°+/-8°), (0°+/-5°, $\theta$, 00+/-50), (10°+/-5°, $\theta$, 0+/-50), (20°+/-5°, $\theta$, 0+/-5), (0°+/-5°, $\theta$, 90°+/-5°), (10°+/-5°, $\theta$, 90°+/-5°), (20°+/-5°, $\theta$, 90°+/-5°), (90°+/-5°, 90°+/-5°, $\psi$), or orientation angles equivalent thereto, where each of $\theta$ and $\psi$ has a value in a range 0 to 180°.

In some teachings, the present disclosure relates to a method for manufacturing a surface acoustic wave device that provides resonance of a surface acoustic wave having a wavelength $\lambda$. The method includes forming or providing a quartz substrate. The method further includes implementing a piezoelectric plate formed from LiTaO$_3$ or LiNbO$_3$ to be over the quartz substrate, such that the piezoelectric plate has a thickness greater than $2\lambda$. The method further includes forming an interdigital transducer electrode over the piezoelectric plate, such that the interdigital transducer electrode has a mass density $\rho$ and a thickness T greater than $$T_{threshold} = \left(\frac{0.5}{MR}\right)\left[a - b\left(1 - e^{-\rho/c}\right)\right],$$

the quantity MR being a metallization ratio of the interdigital transducer electrode, the quantity a having a value of $0.19091\lambda \pm \delta_a$, the quantity b having a value of $0.17658\lambda \pm \delta_b$, and the quantity c having a value of $9.08282$ g/cm$^3 \pm \delta_c$.

In some embodiments, the implementing of the piezoelectric plate can include forming or providing an assembly of a relatively thick piezoelectric plate and a quartz plate. The implementing of the piezoelectric plate can further include performing a thinning process on the relatively thick piezoelectric plate to provide the piezoelectric plate with the thickness greater than 2λ, such that the piezoelectric plate includes a first surface that engages with the quartz plate and a second surface, opposite from the first surface, resulting from the thinning process. The thinning process can include, for example, a polishing process.

In some embodiments, the forming the interdigital transducer electrode over the piezoelectric plate can include forming the interdigital transducer electrode on the second surface of the piezoelectric plate. In some embodiments, the quartz plate of the assembly can be substantially the same as the quartz substrate.

In some embodiments, the implementing of the piezoelectric plate can include forming or providing an assembly of a relatively thick piezoelectric plate and a handling substrate. The implementing of the piezoelectric plate can further include performing a thinning process on the relatively thick piezoelectric plate to provide a thinned piezoelectric plate with a thickness greater than 2λ, such that the thinned piezoelectric plate includes a first surface resulting from the thinning process and a second surface, opposite from the first surface, that engages the handling substrate. The thinning process include, for example, a polishing process.

In some embodiments, the implementing of the piezoelectric plate can further include attaching a quartz plate to the first surface of the thinned piezoelectric plate. The implementing of the piezoelectric plate can further include removing the handling substrate to expose the second surface of the thinned piezoelectric plate. The removing of the handling substrate include, for example, an etching process.

In some embodiments, the forming the interdigital transducer electrode over the piezoelectric plate can include forming the interdigital transducer electrode on the exposed second surface of the piezoelectric plate. In some embodiments, the quartz plate attached to the first surface of the piezoelectric plate can be substantially the same as the quartz substrate.

In accordance with some implementations, the present disclosure relates to a radio-frequency filter that includes an input node for receiving a signal and an output node for providing a filtered signal. The radio-frequency filter further includes a surface acoustic wave device implemented to be electrically between the input node and the output node. The surface acoustic wave device is configured to provide resonance of a surface acoustic wave having a wavelength λ and includes a quartz substrate and a piezoelectric plate formed from LiTaO$_3$ or LiNbO$_3$ and disposed over the quartz substrate. The piezoelectric plate has a thickness greater than 2λ. The surface acoustic wave device further includes an interdigital transducer electrode formed over the piezoelectric plate. The interdigital transducer electrode has a mass density ρ and a thickness T greater than $$T_{threshold} = \left(\frac{0.5}{MR}\right)\left[a - b\left(1 - e^{-\rho/c}\right)\right],$$

with the quantity MR being a metallization ratio of the interdigital transducer electrode, the quantity a having a value of $0.19091\lambda \pm \delta_a$, the quantity b having a value of $0.17658\lambda \pm \delta_b$, and the quantity c having a value of $9.08282$ g/cm$^3 \pm \delta_c$.

In some implementations, the present disclosure relates to a radio-frequency module that includes a packaging substrate configured to receive a plurality of components, and a radio-frequency circuit implemented on the packaging substrate and configured to support either or both of transmission and reception of signals. The radio-frequency module further includes a radio-frequency filter configured to provide filtering for at least some of the signals. The radio-frequency filter includes a surface acoustic wave device configured to provide resonance of a surface acoustic wave having a wavelength λ. The surface acoustic wave device includes a quartz substrate and a piezoelectric plate formed from LiTaO$_3$ or LiNbO$_3$ and disposed over the quartz substrate. The piezoelectric plate has a thickness greater than 2λ. The surface acoustic wave device further includes an interdigital transducer electrode formed over the piezoelectric plate. The interdigital transducer electrode has a mass density ρ and a thickness T greater than $$T_{threshold} = \left(\frac{0.5}{MR}\right)\left[a - b\left(1 - e^{-\rho/c}\right)\right],$$

with the quantity MR being a metallization ratio of the interdigital transducer electrode, the quantity a having a value of $0.19091\lambda \pm \delta_a$, the quantity b having a value of $0.17658\lambda \pm \delta_b$, and the quantity c having a value of $9.08282$ g/cm$^3 \pm \delta_c$.

In some teachings, the present disclosure relates to a wireless device that includes a transceiver, an antenna, and a wireless system implemented to be electrically between the transceiver and the antenna. The wireless system includes a filter configured to provide filtering functionality for the wireless system. The filter includes a surface acoustic wave device configured to provide resonance of a surface acoustic wave having a wavelength λ. The surface acoustic wave device includes a quartz substrate and a piezoelectric plate formed from LiTaO$_3$ or LiNbO$_3$ and disposed over the quartz substrate. The piezoelectric plate has a thickness greater than 2λ. The surface acoustic wave device further includes an interdigital transducer electrode formed over the piezoelectric plate. The interdigital transducer electrode has a mass density ρ and a thickness T greater than $$T_{threshold} = \left(\frac{0.5}{MR}\right)\left[a - b\left(1 - e^{-\rho/c}\right)\right],$$

with the quantity MR being a metallization ratio of the interdigital transducer electrode, the quantity a having a value of $0.19091\lambda \pm \delta_a$, the quantity b having a value of $0.17658\lambda \pm \delta_b$, and the quantity c having a value of $9.08282$ g/cm$^3 \pm \delta_c$.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

DETAILED DESCRIPTION OF SOME EMBODIMENTS

The headings provided herein, if any, are for convenience only and do not necessarily affect the scope or meaning of the claimed invention.

Figure 1:
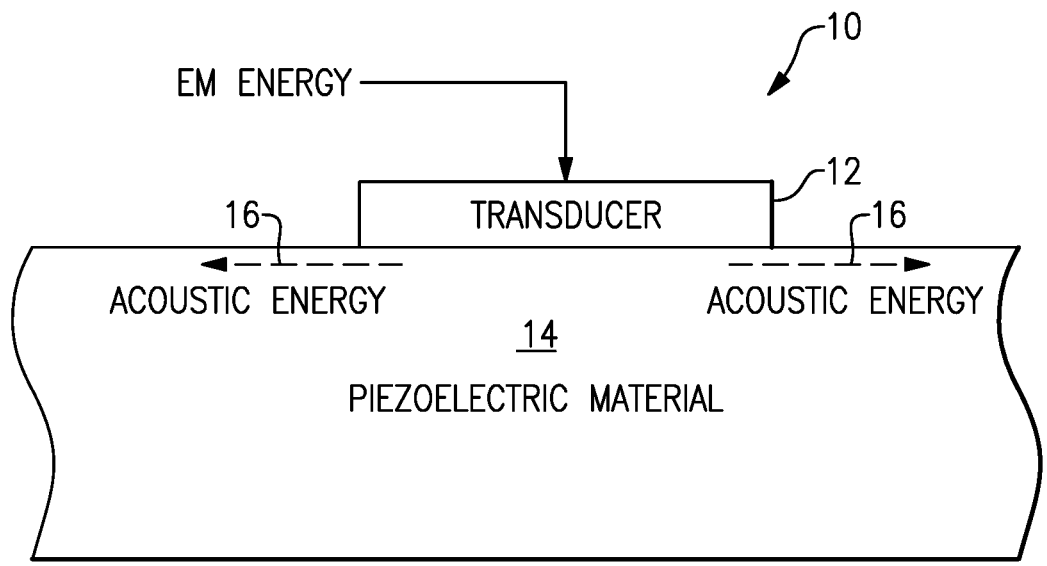
FIG. 1 depicts a surface acoustic wave device that includes a transducer implemented on a piezoelectric material, such that when an electromagnetic (EM) energy is applied to the piezoelectric material through the transducer, some or all of the EM energy is converted to an acoustic energy that propagates from the transducer as surface acoustic waves.

FIG. 1 depicts a surface acoustic wave device 10 that includes a transducer 12 implemented on a piezoelectric material 14. When an electromagnetic (EM) energy is applied to the piezoelectric material 14 through the transducer 12, some or all of the EM energy is converted to an acoustic energy; and at least some of such an acoustic energy propagates from the transducer 12 as surface acoustic waves 16.

Figure 2:
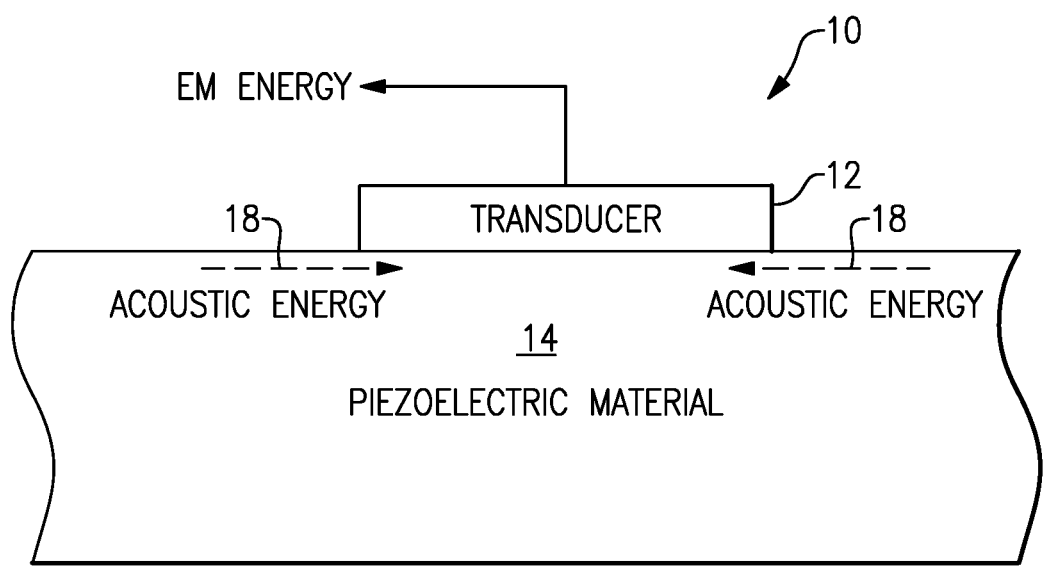
FIG. 2 shows that the surface acoustic wave device of FIG. 1 can also function in reverse, such that some or all of an acoustic energy associated with surface acoustic waves supported by a piezoelectric material is converted to an EM energy through the transducer.

FIG. 2 shows that the surface acoustic wave device 10 can also function in reverse, such that some or all of acoustic energy associated with surface acoustic waves 18 supported by a piezoelectric material 14 are converted to an EM energy through a transducer 12. It is noted that the transducer 12 of FIG. 2 can be the same transducer 12 as in FIG. 1, or a separate transducer in addition to the transducer 12 of FIG. 1. In the latter configuration where two transducers are provided, the corresponding surface acoustic wave device can be utilized as, for example, a surface acoustic wave filter. In such an application, the transducers 12 can be configured such that the surface acoustic wave has a resonance frequency selected such that the incoming EM energy in the form of an EM signal is filtered to provide a frequency for the outgoing EM energy that corresponds to the resonance frequency of the surface acoustic wave.

Figure 3:
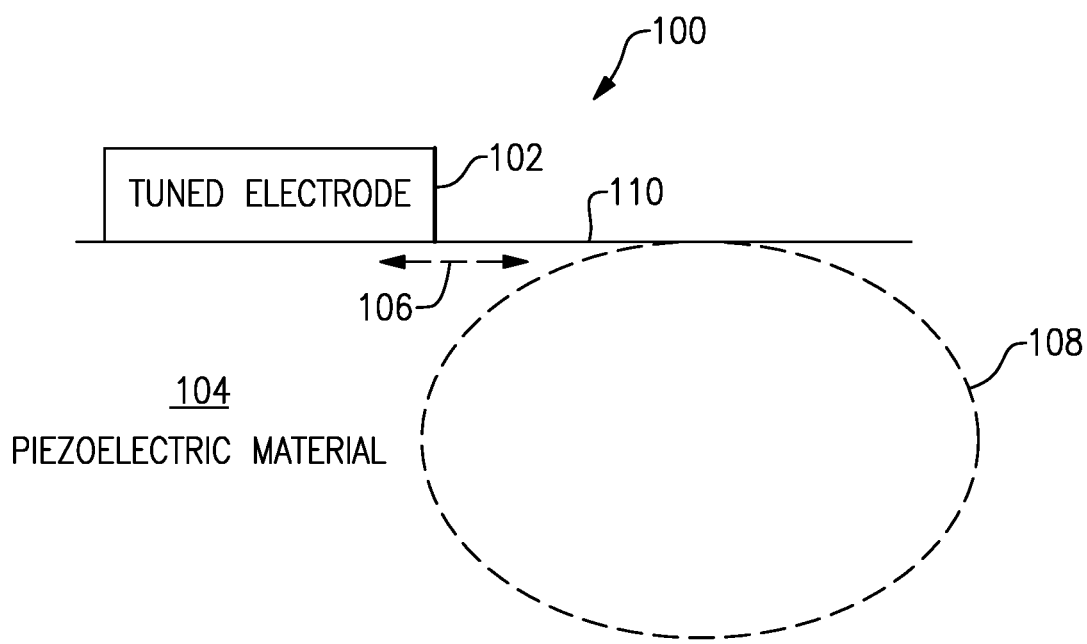
FIG. 3 shows that in some embodiments, a surface acoustic wave device can include a tuned electrode configured to provide some or all of the transducer functionalities of FIGS. 1 and 2.

FIG. 3 shows that in some embodiments, a surface acoustic wave device 100 can include a tuned electrode 102 configured to provide the transducer functionality of FIGS. 1 and 2. More particularly, the tuned electrode 102 can be configured such that a surface acoustic wave 106 (travelling away from the electrode 102 or travelling to the electrode 102) supported by a piezoelectric material 104 has desirable performance characteristics for a given volume 108 of the piezoelectric material 104. In the context of the example filtering application, such desirable performance characteristics of the surface acoustic wave 106 can result in the corresponding filtered EM signal to also have desirable performance characteristics.

It is noted that if an electrode is not tuned for a volume such as the volume 108, acoustic energy driven into the volume 108 or received from the volume 108 can result in the electrode being undesirably impacted in a physical manner. In such a situation, the resulting EM signal can include undesirable noises and/or other artifacts, thereby degrading the performance of the corresponding surface acoustic device.

Thus, in some embodiments, the tuned electrode 102 of FIG. 3 can be configured to be physically stable as acoustic energy is driven into or received from the volume 108 of the piezoelectric material 104. In some embodiments, such physically stable feature of the tuned electrode 102 can be provided by the electrode 102 being appropriately massive, depending on one or more factors such a material used for the piezoelectric 104 and the size of the volume 108. For the purpose of description, such an appropriately massive feature of the tuned electrode 102 may be referred to herein as being mass-loaded. Examples of how electrodes can be mass-loaded are described herein in greater detail.

Figure 4:
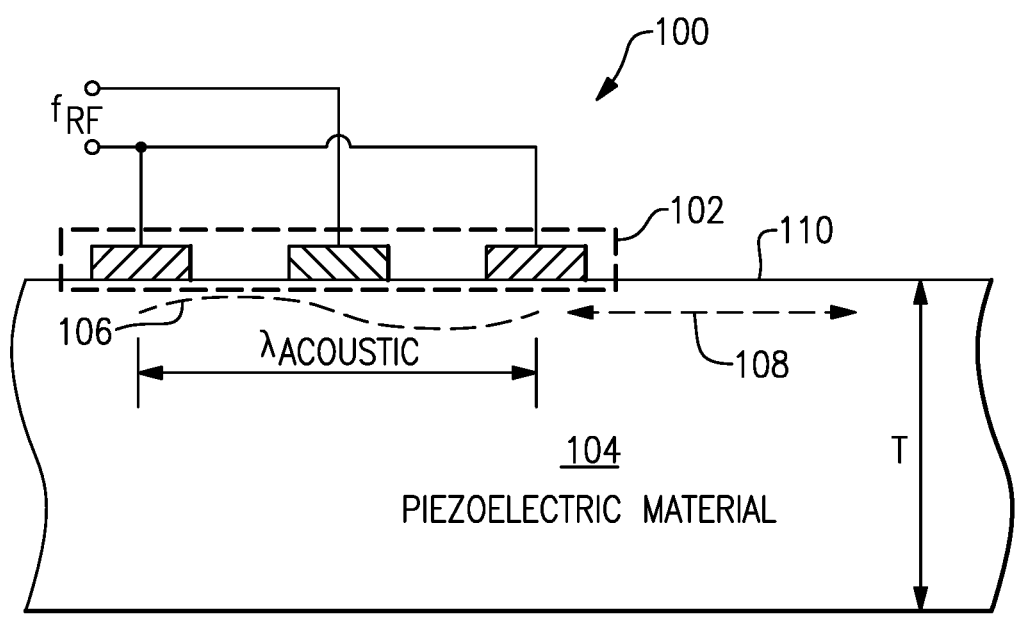
FIG. 4 shows an example of a surface acoustic wave device where a tuned electrode is implemented as an interdigital transducer (IDT) on a surface of a piezoelectric layer having a thickness T.

FIG. 4 shows an example of a surface acoustic wave device 100 where a tuned electrode 102 is implemented as an interdigital transducer (IDT) on a surface 110 of a piezoelectric layer 104 having a thickness T. In such a configuration, a first set of one or more fingers can be arranged in an interdigitized manner with a second set of one or more fingers. When an EM signal such as a radio-frequency (RF) signal (having a frequency $f_{RF}$) is applied to respective terminals of the first and second sets of fingers, a surface acoustic wave 108 having a wavelength $\lambda_{ACOUSTIC}$ is generated in the piezoelectric layer 104. In reverse, when a surface acoustic wave 108 having a wavelength $\lambda_{ACOUSTIC}$ is incident on the first and second sets of fingers, an RF signal having a frequency $f_{RF}$ is generated on the respective terminals. It is noted that in the foregoing configuration, the wavelength $\lambda_{ACOUSTIC}$ is approximately the same as the distance between two neighboring fingers of the same set.

As shown in FIG. 4, the piezoelectric layer 104 has a thickness T which can be a design factor for which the electrode 102 can be tuned. Examples of such tuning of the electrode 102 based at least in part on the thickness (T) of the piezoelectric layer 104 are described herein in greater detail.

Figure 5:
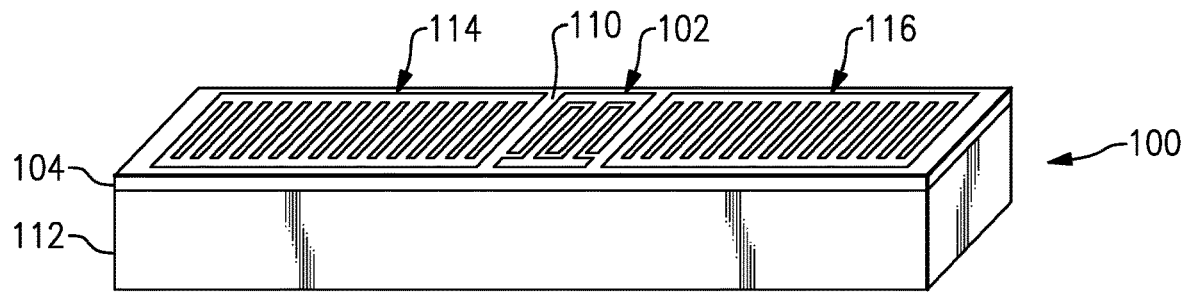
FIG. 5 shows an example of a surface acoustic wave (SAW) device implemented as a SAW resonator.

FIG. 5 shows an example of a surface acoustic wave (SAW) device 100 implemented as a SAW resonator. Such a SAW resonator can include a piezoelectric layer 104 formed of, for example, LiTaO$_3$ (also referred to herein as lithium tantalate or LT) or LiNbO$_3$ (also referred to herein as lithium niobate or LN). Such a piezoelectric layer can include a first surface 110 (e.g., an upper surface when the SAW resonator 100 is oriented as shown) and an opposing second surface. The second surface of the piezoelectric layer 104 can be attached to, for example, a quartz substrate 112.

Figure 6:
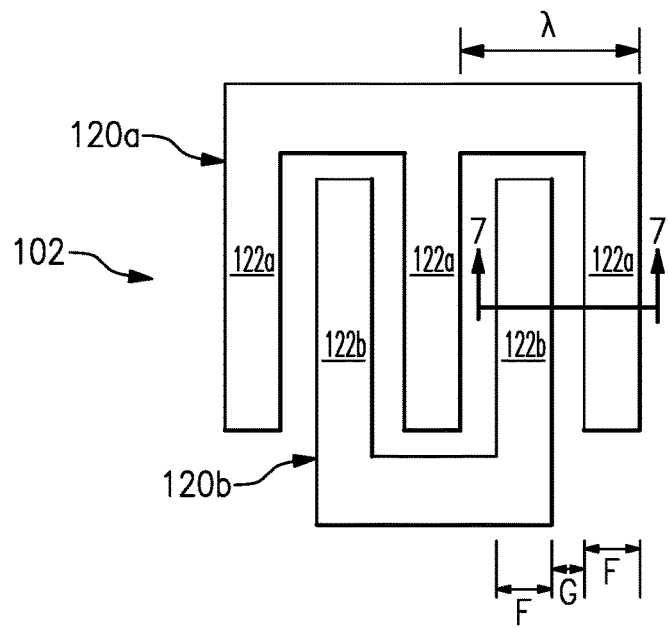
FIG. 6 shows an enlarged and isolated plan view of the IDT electrode of the SAW resonator of FIG. 5.

On the first surface 110 of the piezoelectric layer 104, an interdigital transducer (IDT) electrode 102 can be implemented, as well as one or more reflector assemblies (e.g., 114, 116). FIG. 6 shows an enlarged and isolated plan view of the example IDT electrode 102 of the SAW resonator 100 of FIG. 5. It will be understood that the IDT electrode 102 of FIGS. 5 and 6 can included more or less numbers of fingers for the two interdigitized sets of fingers.

In the example of FIG. 6, the IDT electrode 102 is shown to include a first set 120a of fingers 122a and a second set 120b of fingers 122b arranged in an interdigitized manner. As described herein, the distance between two neighboring fingers of the same set (e.g., neighboring fingers 122a of the first set 120a) is approximately the same as the wavelength $\lambda$ of a surface acoustic wave associated with the IDT electrode 102.

In the example of FIG. 6, various dimensions associated with the fingers are shown. More particularly, each finger (122a or 122b) is shown to have a lateral width of F, and a gap distance of G is shown to be provided between two interdigitized neighboring fingers (122a and 122b).

Figure 7:
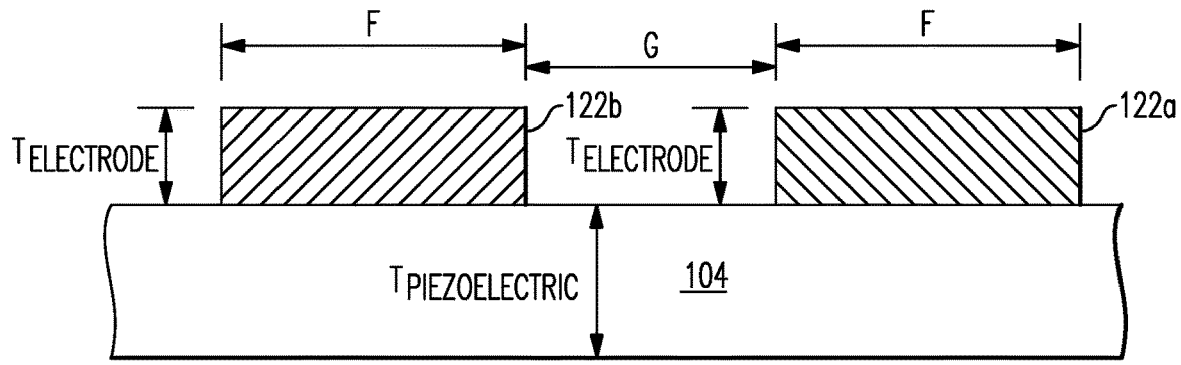
FIG. 7 shows a sectional view as indicated in FIG. 6.

FIG. 7 shows a sectional view as indicated in FIG. 6. The indicated dimensions F and G are as described in reference to FIG. 6, and each finger (122a or 122b) is shown to have a thickness of $T_{electrode}$. FIG. 7 also shows that the piezoelectric layer 104 has a thickness of $T_{piezoelectric}$.

It is noted that a SAW resonator 100 as described in reference to FIGS. 5-7 can be configured to provide, for example, excellent filtering functionality. As an example, it is noted that mobile phones and smartphones utilize many frequency bands (e.g., almost eighty bands) and some or all of such frequency bands are congested at 3.4 GHz or lower, such that adjacent bands are very narrowly separated in frequency. Accordingly, there is an intense need or desire for RF filters having steeper and better temperature characteristics to prevent interference between adjacent bands.

In some embodiments, a filter providing a desired temperature characteristic, a higher Q, and/or a higher impedance ratio, can include a LiTaO$_3$ (also referred to herein as LT) thin plate or a LNbO$_3$ (also referred to herein as LN) thin plate that has a negative thermal coefficient of frequency (TCF) combined with quartz having orientation angles for a positive TCF. With such a configuration, desired performance features such as an improved TCF and a higher impedance ratio can be obtained. However, the LT or LN plate is typically relatively thin (e.g., thinner than approximately 1 μm). Such a thin LT or LN plate can be obtained by a thinning process. Accordingly, problems such as yield and/or cost may arise during the thinning process such as a polishing process.

Various examples are described herein in the context of a piezoelectric layer or plate being an LT layer or plate. It will be understood that one or more features of the present disclosure can also be implemented with other piezoelectric layers or plates, including, for example, an LN layer or plate.

Figure 8A:
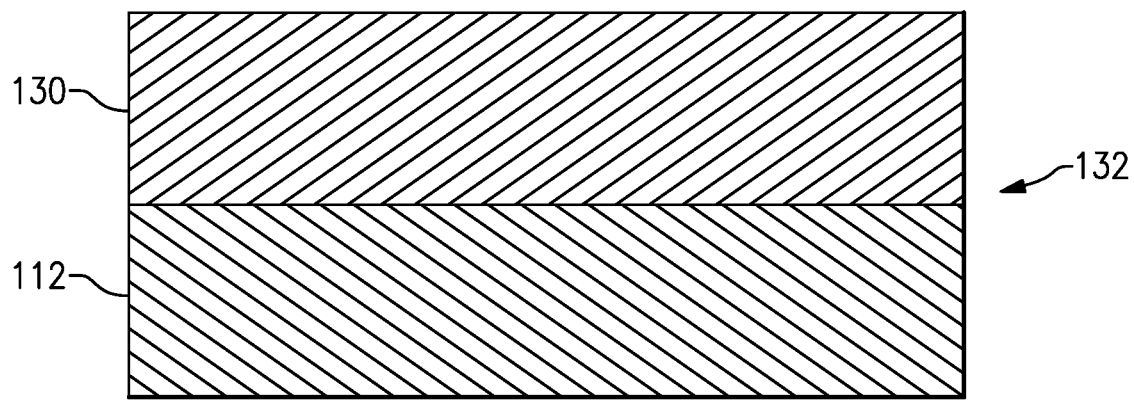
FIGS. 8A to 8C show an example of a thinning process that can be utilized to obtain a thin piezoelectric plate such as a thin $LiTaO_3$ (LT) plate.
Figure 8B:
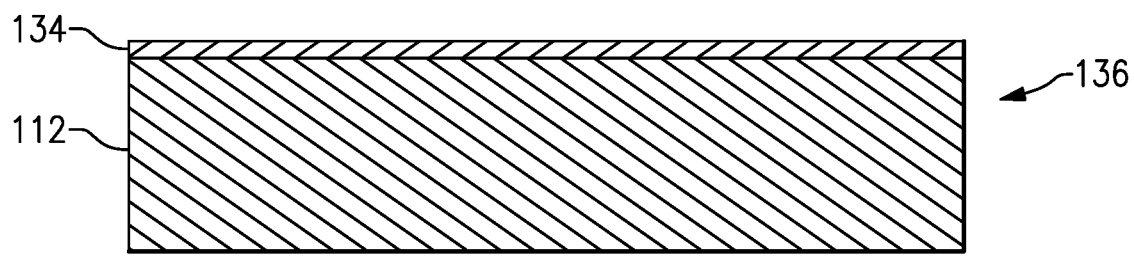
Figure 8C:
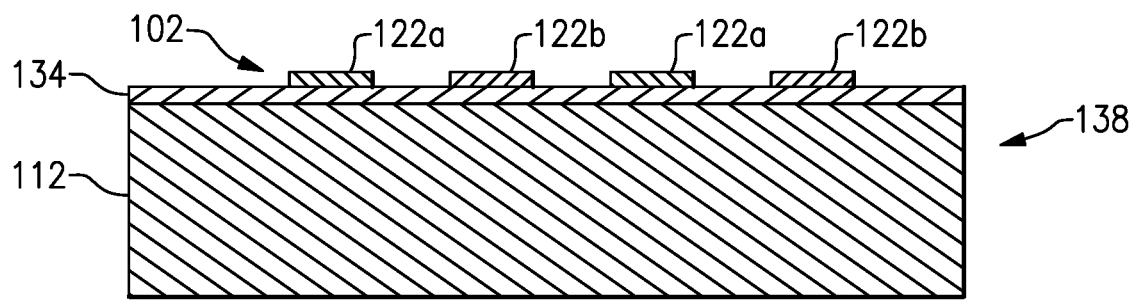

FIGS. 8A-8C show an example of a thinning process that can be utilized to obtain the above-described thin LT plate. It will be understood that the example thinning process of FIGS. 8A-8C can also be utilized to obtain an LT plate associated with a tuned electrode having one or more features as described herein.

FIGS. 9A-9E show another example of a thinning process that can be utilized to obtain the above-described thin LT plate. It will be understood that the example thinning process of FIGS. 9A-9E can also be utilized to obtain an LT plate associated with a tuned electrode having one or more features as described herein.

In the first example, FIG. 8A shows that in some embodiments, a thinning process can include a process step where an assembly 132 of a relatively thick LT plate 130 and a quartz plate 112 is formed or provided.

FIG. 8B shows a process step where the thickness of the relatively thick LT plate 130 is reduced to a thinner LT plate 134, so as to form an assembly 136. In some embodiments, such a thinning process step can be achieved by, for example, polishing process such as a mechanical polishing process, a chemical mechanical process, etc. In FIG. 8B, the thinner LT plate 134 is shown to include a first surface that engages with the quartz plate 112 (directly or through an intermediate layer), and a second surface, opposite from the first surface, resulting from the thinning process step.

FIG. 8C shows a process step where an electrode 102 is formed on the second surface of the LT plate 134, so as to form an assembly 138. As described herein, such an electrode can include an interdigitized arrangement of fingers 122a, 122b.

In some embodiments, some or all of the process steps associated with FIGS. 8A-8C can be implemented for an individual unit to produce a single unit of the assembly 138, implemented for a plurality of individual units to produce a plurality of respective single units of assemblies 138, implemented while a plurality units are attached in an array format (e.g., wafer format) followed by singulation to produce a plurality of singulated units of assemblies 138, or some combination thereof.

Figure 9A:
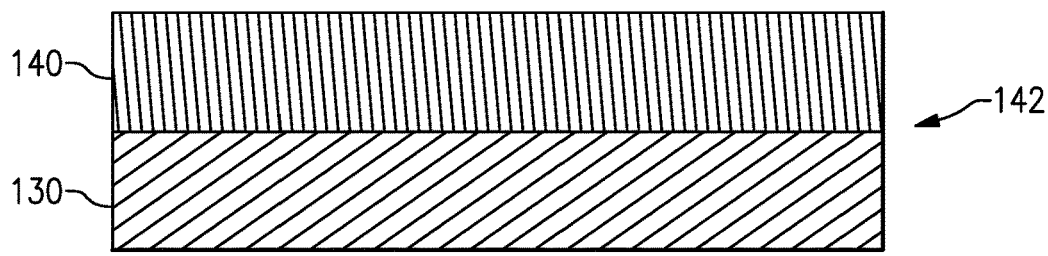
FIGS. 9A to 9E show another example of a thinning process that can be utilized to obtain a thin piezoelectric plate such as a thin $LiTaO_3$ (LT) plate.

In the second example, FIG. 9A shows that in some embodiments, a thinning process can include a process step where an assembly 142 of a relatively thick LT plate 130 and a handling substrate (e.g., silicon substrate) 140 is formed or provided.

Figure 9B:
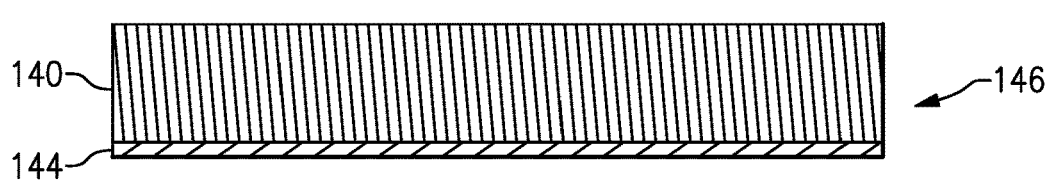

FIG. 9B shows a process step where the thickness of the relatively thick LT plate 130 is reduced to a thinner LT plate 144, so as to form an assembly 146. In some embodiments, such a thinning process step can be achieved by, for example, polishing process such as a mechanical polishing process, a chemical mechanical process, etc. In FIG. 9B, the thinner LT plate 144 is shown to include a first surface resulting from the thinning process step, and a second surface, opposite from the first surface, attached to the handling substrate 140.

Figure 9C:
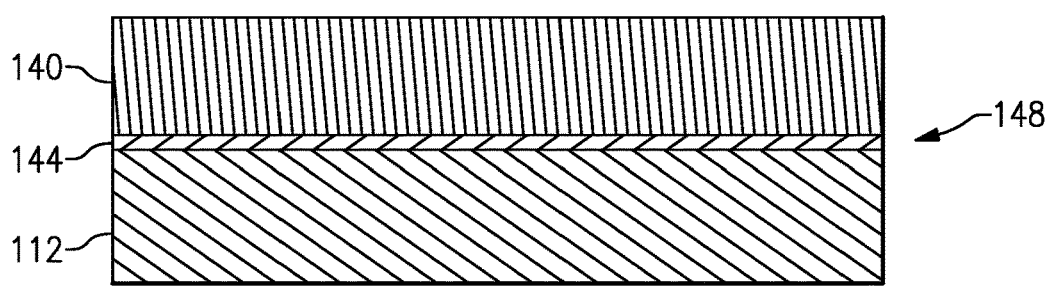

FIG. 9C shows a process step where the first surface of the LT plate 144 is attached to a quartz plate 112, so as to form an assembly 148. In some embodiments, the first surface of the LT plate 144 can be attached (e.g., bonded) directly to the quartz plate 112, or through an intermediate layer.

Figure 9D:
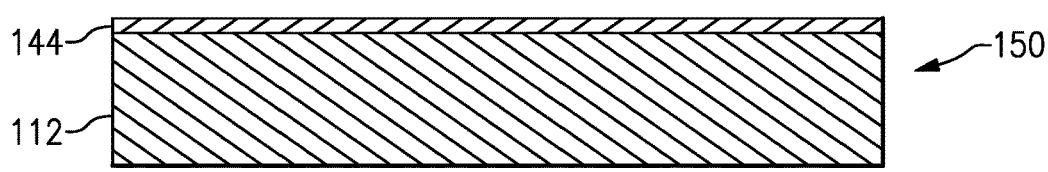

FIG. 9D shows a process step where the handling substrate (140 in FIG. 9C) is removed so as to partially or fully expose the LT plate 144, to thereby form an assembly 150. In some embodiments, such removal of the handling substrate (such as a silicon substrate) can be achieved by, for example, an etching process. In some embodiments, the LT plate 144 in the assembly 150 of FIG. 9D may or may not be substantially the same as the LT plate 144 in the assembly 148 of FIG. 9C. For the purpose of description, it will be understood that the exposed surface resulting from the removal of the handling substrate is similar to the second surface of the LT plate 144 described in reference to FIG. 9B.

Figure 9E:
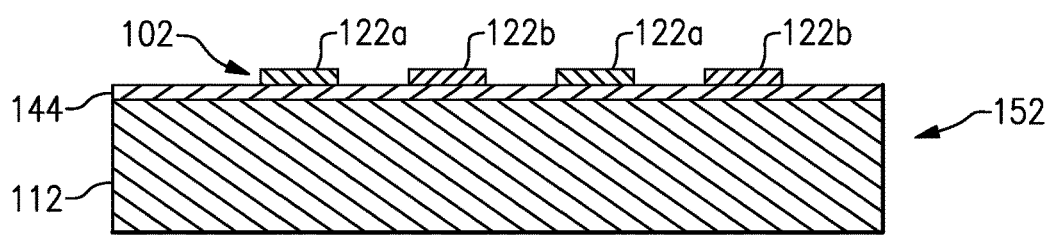

FIG. 9E shows a process step where an electrode 102 is formed on the second surface of the LT plate 144, so as to form an assembly 152. As described herein, such an electrode can include an interdigitized arrangement of fingers 122a, 122b.

In some embodiments, some or all of the process steps associated with FIGS. 9A-9E can be implemented for an individual unit to produce a single unit of the assembly 152, implemented for a plurality of individual units to produce a plurality of respective single units of assemblies 152, implemented while a plurality units are attached in an array format (e.g., wafer format) followed by singulation to produce a plurality of singulated units of assemblies 152, or some combination thereof.

Figure 10A:
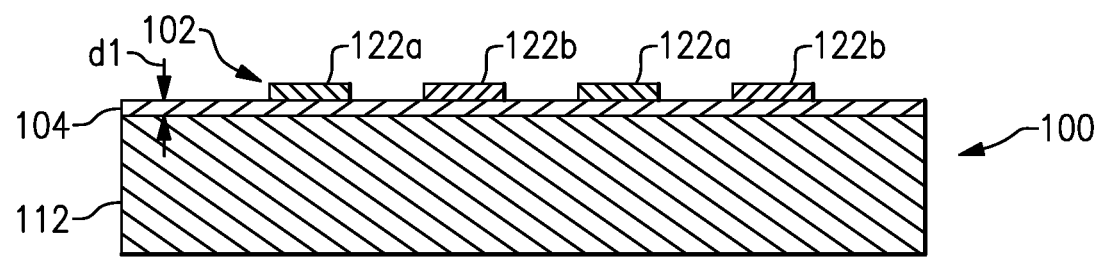
FIG. 10A shows an example of a SAW resonator that can be formed by either of the processes of FIGS. 8A to 8C and FIGS. 9A to 9E.

FIG. 10A shows a SAW resonator 100 that can be formed by either of the processes described in reference to FIGS. 8A-8C and FIGS. 9A-9E. If the process of FIGS. 8A-8C is utilized, the assembly 138 of FIG. 8C can be the SAW resonator 100 of FIG. 10A. If the process of FIGS. 9A-9E is utilized, the assembly 152 of FIG. 9E can be the SAW resonator 100 of FIG. 10A. For the purpose of description, the LT plate 104 having a thickness d1 can be considered to be a thin LT plate. Example thickness values and/or ranges of such a thin LT plate are provided herein.

Figure 10B:
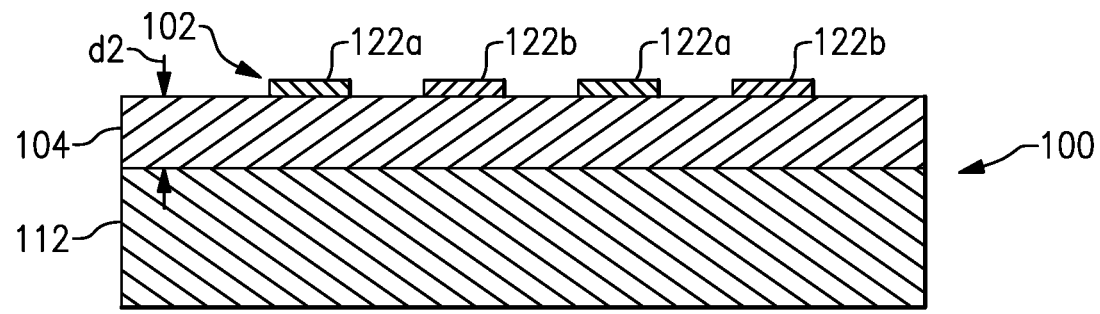
FIG. 10B shows another example of a SAW resonator that can be formed by either of the processes of FIGS. 8A to 8C and FIGS. 9A to 9E.

FIG. 10B shows a SAW resonator 100 that can be formed by either of the processes described in reference to FIGS. 8A-8C and FIGS. 9A-9E. If the process of FIGS. 8A-8C is utilized, the assembly 138 of FIG. 8C can be the SAW resonator 100 of FIG. 10B. If the process of FIGS. 9A-9E is utilized, the assembly 152 of FIG. 9E can be the SAW resonator 100 of FIG. 10B. For the purpose of description, the LT plate 104 having a thickness d2 can be considered to be a thick LT plate. Example thickness values and/or ranges of such a thick LT plate are provided herein.

FIGS. 11A-11D show examples where a thick LT plate 104b (with thickness d2) can be preferable over a thin LT plate 104a (with thickness d1). In such examples, the LT plates are depicted by themselves, however, it will be understood that such LT plates can be attached to respective substrates (e.g., handling substrate and/or quartz substrate). It will also be understood that some or all of the effects in the examples of FIGS. 11A-11D can be manifested for the respective LT plates, whether or not such LT plates are attached to other parts.

Figure 11A:
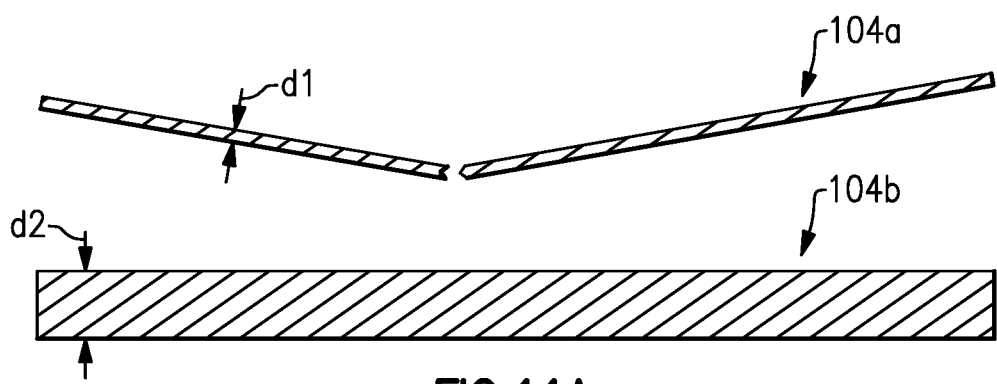
FIGS. 11A to 11D show examples where a thick LT plate can be preferable over a thin LT plate.
Figure 11B:
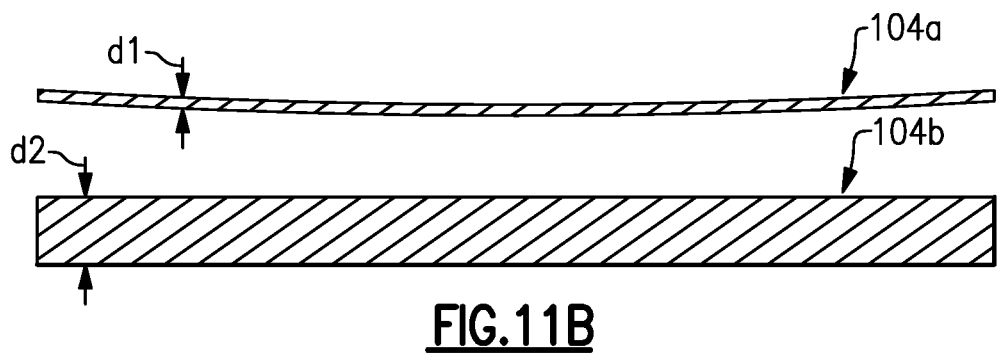

For example, and referring to FIG. 11A, a thin LT plate 104a is typically more susceptible to breakage than a thick LT plate 104b, for a given application of force. In another example, and referring to FIG. 11B, a thin LT plate 104a is typically more susceptible to warpage than a thick LT plate 104b, for a given warping condition.

It is noted that in some applications, performance of a SAW resonator may depend on uniformity of thickness of an LT plate. Thus, and referring to FIG. 11C, an LT plate may have a non-uniform thickness resulting from, for example, a tilted thinning operation. For example, suppose that each of a thin LT plate 104a and a thick LT plate 104b is subjected to a similar tilted thinning operation, so as to result in a wedge-shaped side profile. The thin LT plate 104a is shown to have an average thickness value of d1, a high thickness value of d1+Δd, and a low thickness value of d1−Δd. Similarly, the thick LT plate 104b is shown to have an average thickness value of d2, a high thickness value of d2+Δd, and a low thickness value of d2−Δd. For each plate, relative error in thickness can be estimated as Δd/(average thickness). Thus, the thick LT plate 104b will have a lower relative error in thickness than the thin LT plate 104a, for a given thickness error condition Δd.

Figure 11C:
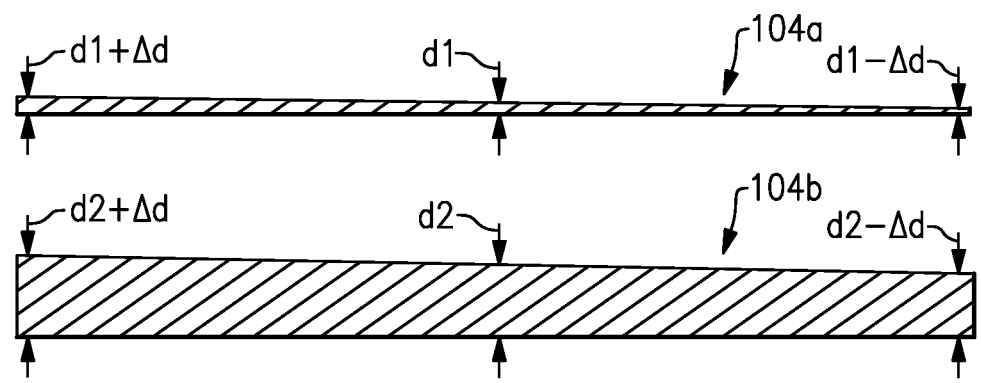
Figure 11D:
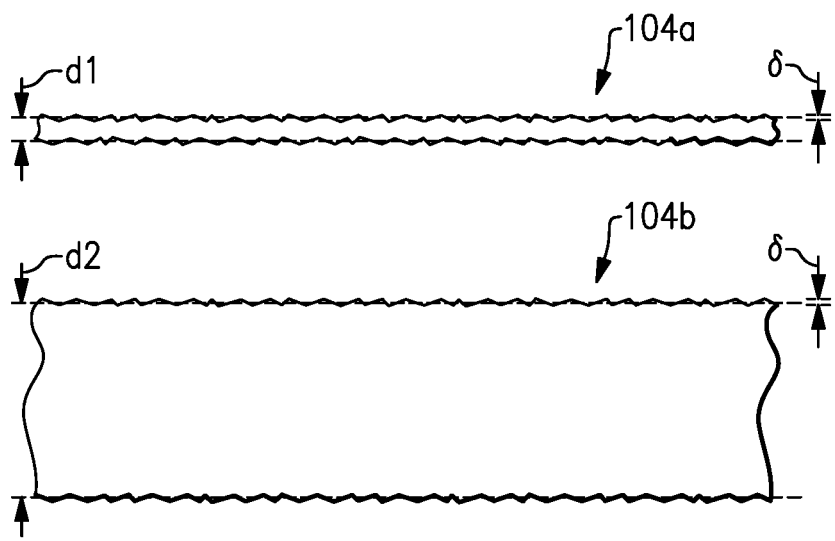

In the example of FIG. 11C, the thickness error condition Δd is assumed to be due to an error resulting from a thinning process. FIG. 11D shows that even if such a thinning process yields a uniform average thickness for a plate, either or both surfaces of the plate can have imperfections resulting from, for example, the thinning process itself or a previous fabrication step related to the plate.

In FIG. 11D, such imperfections are depicted in an exaggerated manner for each surface of a thin LT plate 104a (having an average thickness d1), and for each surface of a thick LT plate 104b (having an average thickness d2). Assuming that each of such surfaces has an imperfection error of δ, relative error in thickness can be estimated as 2δ/(average thickness). Thus, the thick LT plate 104b will have a lower relative error in thickness than the thin LT plate 104a, for a given surface imperfection error condition δ.

The foregoing examples described in reference to FIGS. 11A-11D show that a thick LT plate may be preferable over a thin LT plate. However, simply making an LT plate thicker can result in degradation of performance.

Figure 12:
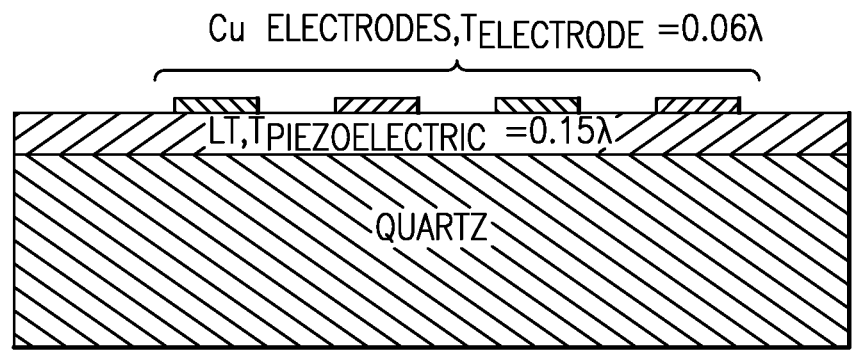
FIG. 12 shows an example of a SAW resonator having an LT plate with a quartz plate attached on one side, and an electrode formed on the other side.

FIGS. 12-19 show four example SAW resonators with different combinations of LT plates and electrodes. For example, FIG. 12 shows a SAW resonator having an LT plate with a quartz plate attached on one side, and an electrode formed on the other side. Referring to the dimensional parameters shown in FIG. 7, the LT plate of FIG. 12 is shown to have a thickness of $T_{piezoelectric}$=0.15λ, and the electrode, formed of copper, is shown to have a thickness of $T_{electrode}$=0.06λ.

Figure 13:
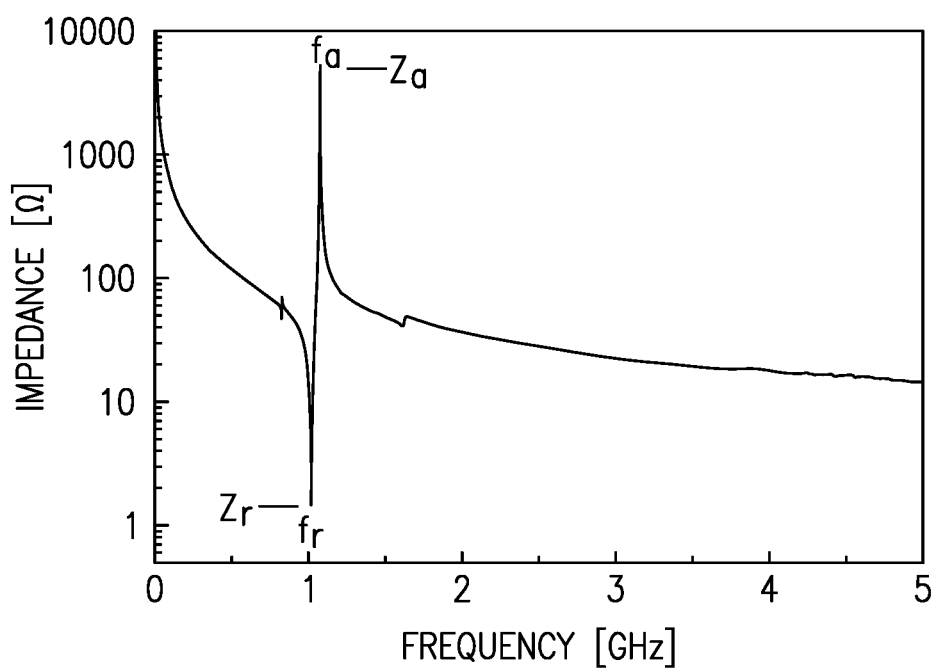
FIG. 13 shows an impedance characteristic plot for the SAW resonator of FIG. 12.

FIG. 13 shows an impedance characteristic plot for the SAW resonator of FIG. 12. In FIG. 13, resonant frequency $f_r$ and antiresonant frequency $f_a$ are shown; and corresponding impedance values at such frequencies are $Z_r$ and $Z_a$, respectively. For the example of FIGS. 12 and 13, impedance ratio (20 $\log(Z_a/Z_r)$) has a value of 78 dB, and there is essentially no in-band ripple, with little or no spurious response observed at higher frequencies.

Figure 14:
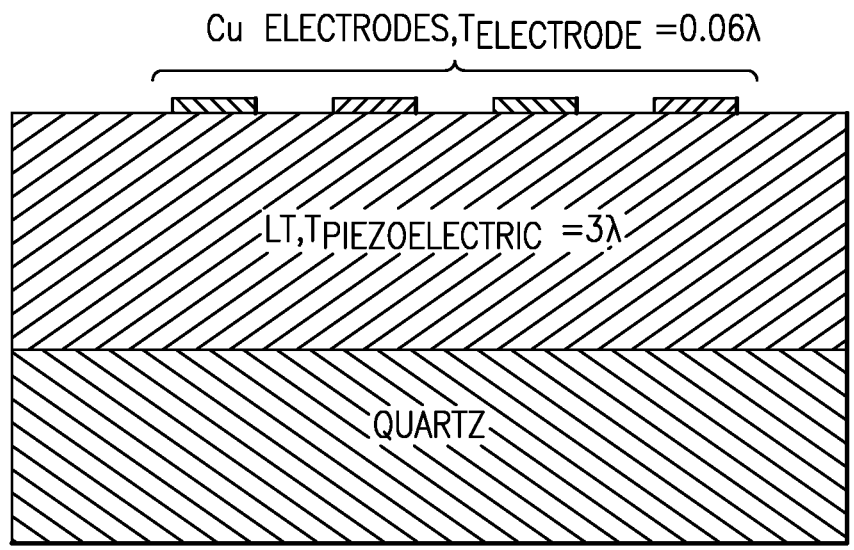
FIG. 14 shows another example of a SAW resonator having an LT plate with a quartz plate attached on one side, and an electrode formed on the other side.

In another example, FIG. 14 shows a SAW resonator having an LT plate with a quartz plate attached on one side, and an electrode formed on the other side. Referring to the dimensional parameters shown in FIG. 7, the LT plate of FIG. 14 is shown to have a thickness of $T_{piezoelectric}$=3λ, and the electrode, formed of copper, is shown to have a thickness of $T_{electrode}$=0.06λ.

Figure 15:
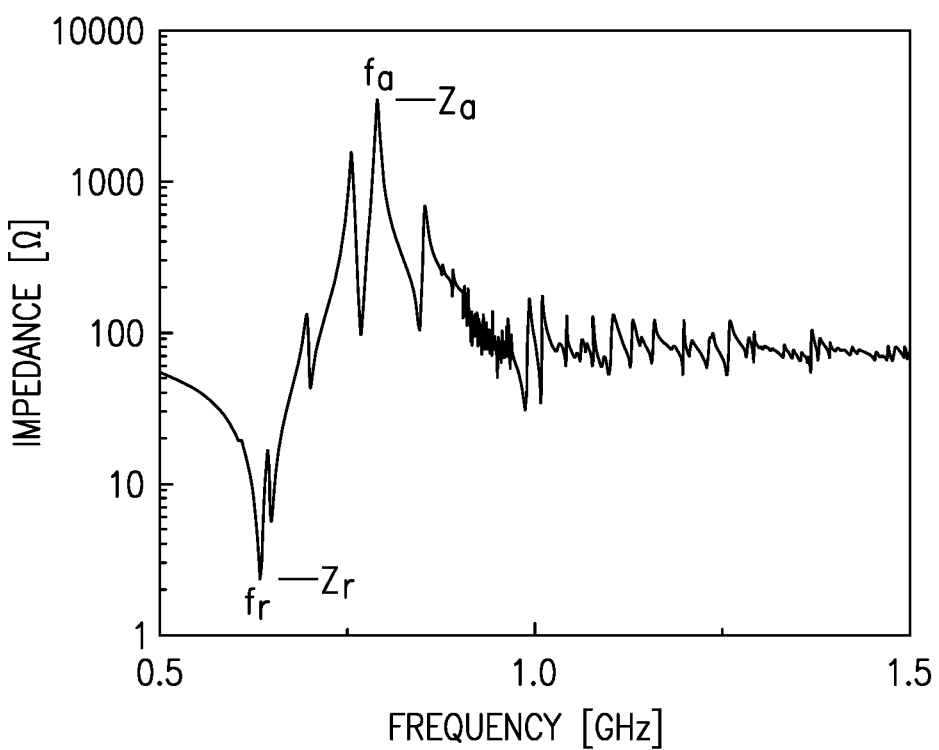
FIG. 15 shows an impedance characteristic plot for the SAW resonator of FIG. 14.

FIG. 15 shows an impedance characteristic plot for the SAW resonator of FIG. 14. In FIG. 15, resonant frequency $f_r$ and antiresonant frequency $f_a$ are shown; and corresponding impedance values at such frequencies are $Z_r$ and $Z_a$, respectively. For the example of FIGS. 14 and 15, impedance ratio (20 $\log(Z_a/Z_r)$) has a value that is lower than the example of FIGS. 12 and 13, and there are larger in-band and out-of-band ripples. Accordingly, such performance characteristics make the SAW resonator of FIG. 14 not practical for many applications.

Figure 16:
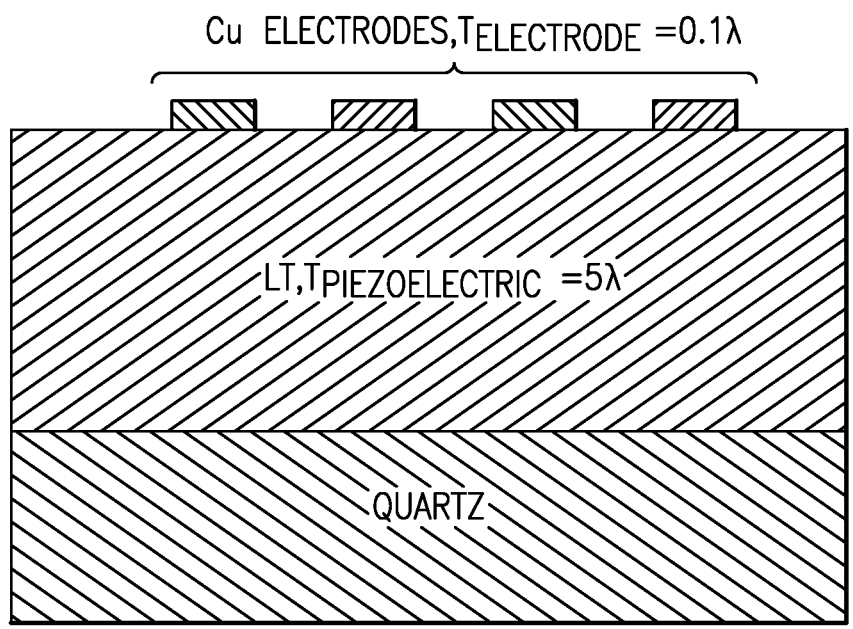
FIG. 16 shows yet another example of a SAW resonator having an LT plate with a quartz plate attached on one side, and an electrode formed on the other side.

In yet another example, FIG. 16 shows a SAW resonator having an LT plate with a quartz plate attached on one side, and an electrode formed on the other side. Referring to the dimensional parameters shown in FIG. 7, the LT plate of FIG. 16 is shown to have a thickness of $T_{piezoelectric}$=5λ, and the electrode, formed of copper, is shown to have a thickness of $T_{electrode}$=0.1λ.

Figure 17:
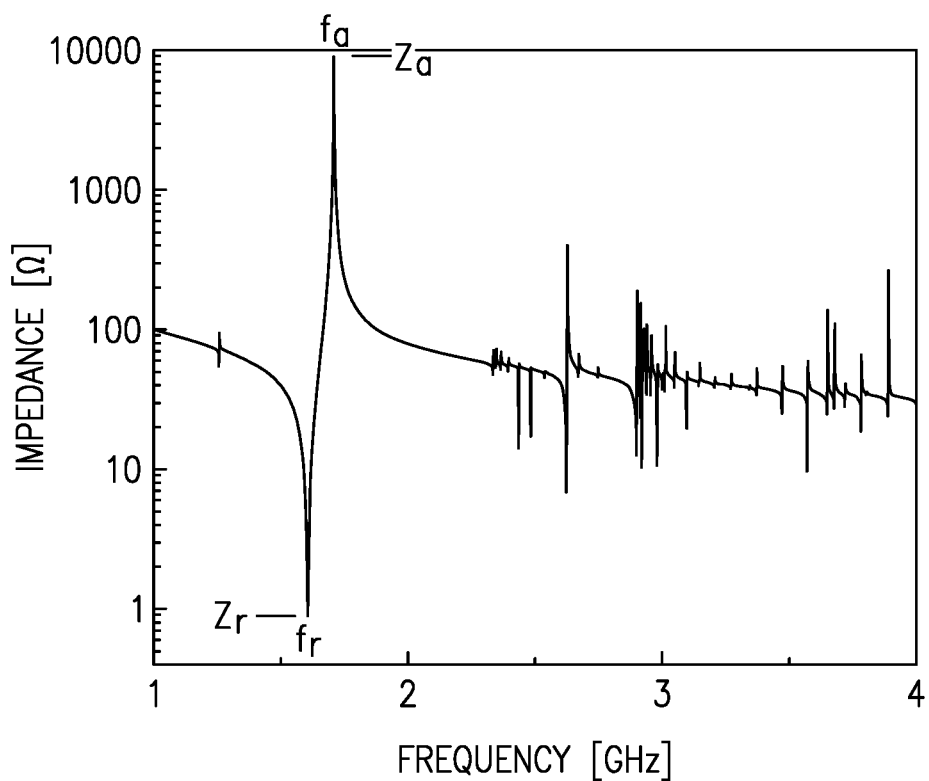
FIG. 17 shows an impedance characteristic plot for the SAW resonator of FIG. 16.

FIG. 17 shows an impedance characteristic plot for the SAW resonator of FIG. 16. In FIG. 17, resonant frequency $f_r$ and antiresonant frequency $f_a$ are shown; and corresponding impedance values at such frequencies are $Z_r$ and $Z_a$, respectively. For the example of FIGS. 16 and 17, impedance ratio (20 $\log(Z_a/Z_r)$) has a value that is higher than the example of FIGS. 14 and 15, and there is little or no in-band ripple, but larger spurious responses at higher frequencies. Thus, the SAW resonator of FIG. 16 may not be practical for many applications.

Figure 18:
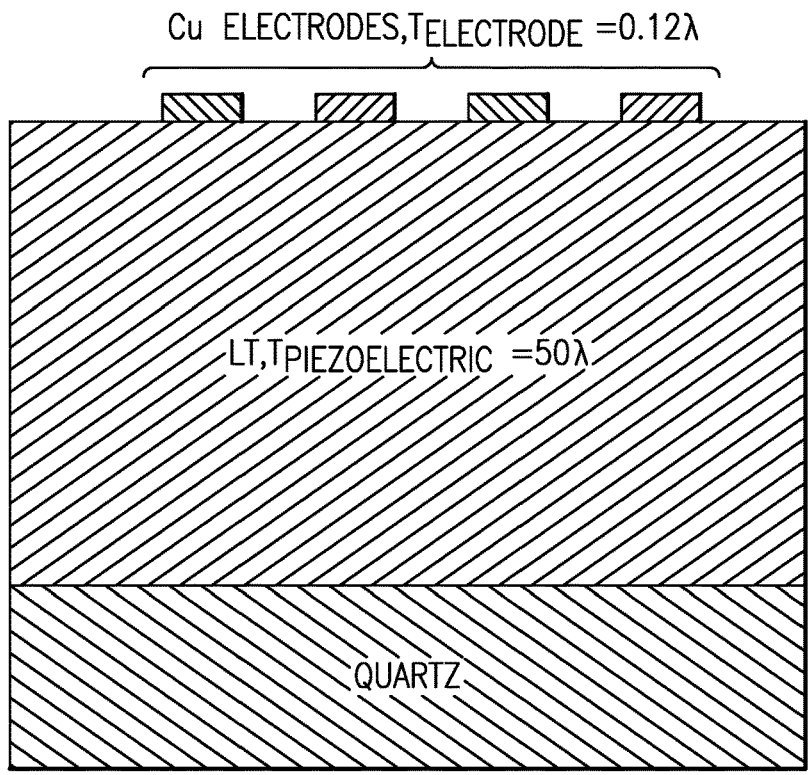
FIG. 18 shows yet another example of a SAW resonator having an LT plate with a quartz plate attached on one side, and an electrode formed on the other side.

In yet another example, FIG. 18 shows a SAW resonator having an LT plate with a quartz plate attached on one side, and an electrode formed on the other side. Referring to the dimensional parameters shown in FIG. 7, the LT plate of FIG. 18 is shown to have a thickness of $T_{piezoelectric}$=50λ, and the electrode, formed of copper, is shown to have a thickness of $T_{electrode}$=0.12λ.

Figure 19:
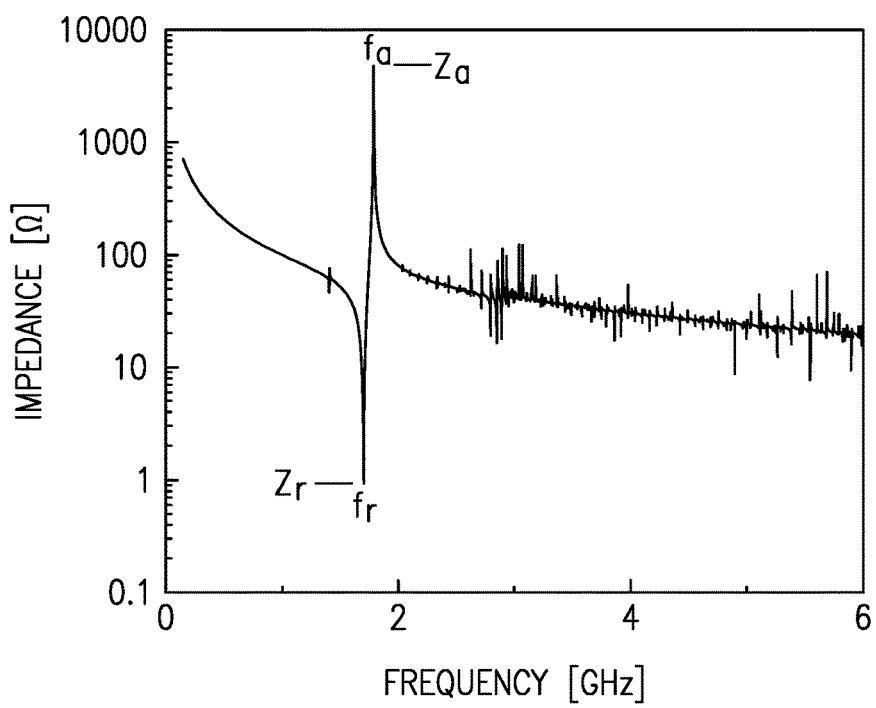
FIG. 19 shows an impedance characteristic plot for the SAW resonator of FIG. 18.

FIG. 19 shows an impedance characteristic plot for the SAW resonator of FIG. 18. In FIG. 19, resonant frequency $f_r$ and antiresonant frequency $f_a$ are shown; and corresponding impedance values at such frequencies are $Z_r$ and $Z_a$, respectively. For the example of FIGS. 18 and 19, impedance ratio (20 $\log(Z_a/Z_r)$) has a value that is similar to the example of FIGS. 12 and 13, and there is essentially no in-band ripple, with some smaller amplitude spurious responses (that are acceptable in many applications) observed at higher frequencies.

A number of observations can be made from the examples of FIGS. 12-19. First, suppose that the SAW resonator of FIG. 12 is an example where the LT plate is considered to be thin ($T_{piezoelectric}$=0.15λ), and the electrode has an appropriate thickness ($T_{electrode}$=0.06λ) for the thin LT plate, such that the SAW resonator provides desirable performance with no in-band ripple and little or no spurious response observed at higher frequencies. However, and referring to the SAW resonator of FIG. 14 where the LT plate thickness is increased significantly to $T_{piezoelectric}$=3λ but the electrode thickness remains the same at $T_{electrode}$=0.06λ, performance of the SAW resonator suffers greatly with large in-band and out-of-band ripples. Such a comparison shows that simply increasing the thickness of the LT plate can result in significant performance degradation.

Second, a comparison between the SAW resonator of FIG. 14 ($T_{piezoelectric}$=3λ, $T_{electrode}$=0.06λ) and the SAW resonator of FIG. 16 ($T_{piezoelectric}$=5λ, $T_{electrode}$=0.1λ) shows that an increase in the electrode thickness (from 0.06λ to 0.1λ) results in a significant improvement in performance, even if the LT plate thickness is increased further ($T_{piezoelectric}$=3λ to $T_{piezoelectric}$=5λ). Such a comparison shows that an increase in electrode thickness can be a factor for improvement in performance for a thicker LT plate.

Third, a comparison between the SAW resonator of FIG. 16 ($T_{piezoelectric}$=5λ, $T_{electrode}$=0.1λ) and the SAW resonator of FIG. 18 ($T_{piezoelectric}$=50λ, $T_{electrode}$=0.12λ) shows that an increase of 20% in the electrode thickness (from 0.1λ to 0.12λ) results in an improvement in performance, even if the LT plate thickness is increased further by an order of magnitude ($T_{piezoelectric}$=5λ to $T_{piezoelectric}$=50λ). Such a comparison shows that either or both of electrode thickness and LT plate thickness can be factor(s) for improvement in performance.

Figure 20:
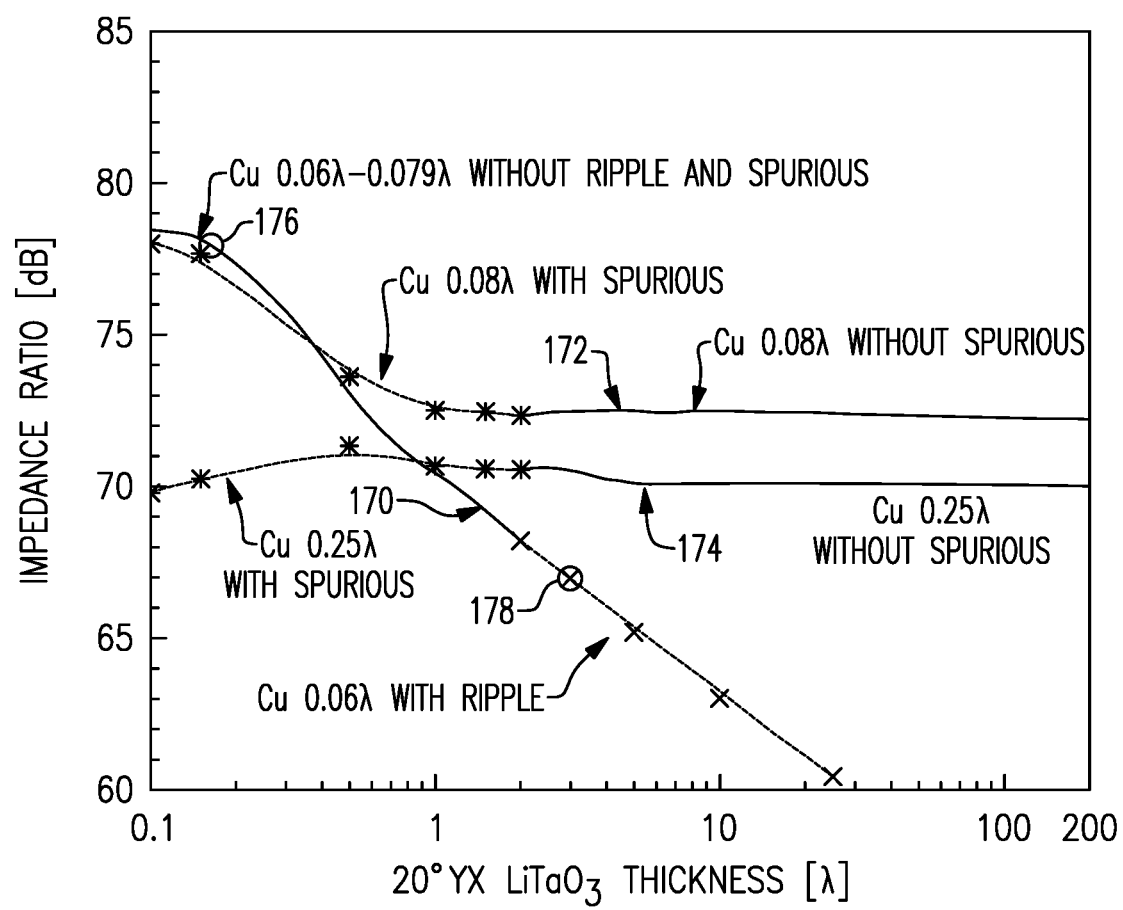
FIG. 20 shows impedance ratio plots as a function of LT plate thickness, for different copper (Cu) electrode thicknesses.

FIG. 20 shows impedance ratio plots as a function of LT plate thickness, for different copper (Cu) electrode thicknesses. More particularly, curve 170 is for a SAW resonator having a copper electrode with a thickness $T_{electrode}$ in a range of 0.06λ to 0.079λ (and thus includes the examples of FIGS. 12 and 14). Curve 172 is for a SAW resonator having a copper electrode with a thickness $T_{electrode}$ of 0.08λ. Curve 174 is for a SAW resonator having a copper electrode with a thickness $T_{electrode}$ of 0.25λ which is thicker than any of the copper electrode examples of FIGS. 12-19.

For each of the three curves (170, 172 or 174) of FIG. 20, the solid-line portion corresponds to impedance ratio responses that are without (or sufficiently low amplitude) ripples or spurious responses (as a function of frequency) to make the corresponding SAW resonator practical for many applications, and the dashed-line portion corresponds to impedance ratio responses having either or both of ripples and spurious responses (as a function of frequency) to make the corresponding SAW resonator impractical for many applications. Thus, example data point 176 on the curve 170, corresponding to the above-described SAW resonator of FIG. 12, is considered to provide acceptable performance, and example data point 178 on the curve 170, corresponding to the above-described SAW resonator of FIG. 14, is considered to provide performance that is not acceptable for many applications.

A number of observations can be made from the impedance ratio plots of FIG. 20. First, it is noted that for a copper electrode thickness up to some value (e.g., at or around 0.079λ), impedance ratio is highest with a thin LT plate (e.g., 0.1λ), and decreases generally monotonically as the LT plate thickness increases. In such a decreasing trend of impedance ratio, a range (e.g., 0λ to about 2λ) of LT plate thickness provides acceptable performance of the corresponding SAW resonator, and a thicker range (e.g., greater than 2λ) of the LT plate results in high ripples and/or spurious responses so as to make the corresponding SAW resonator impractical for many applications. In the latter configuration, one can consider the LT plate to be too thick for the corresponding copper electrode thickness.

Second, it is noted that for a copper electrode thickness greater than the above-discussed value (e.g., at or around 0.079λ), impedance ratio may or may not be the highest with a thin LT plate (e.g., 0.1λ), and eventually reaches an approximately flat impedance ratio as the LT plate thickness increases. For the purpose of description, such a copper electrode thickness value (e.g., at or around 0.079λ) can be considered to be a threshold thickness value.

When a copper electrode thickness is greater than, but close to, the threshold value (e.g., as in the impedance ratio curve 172), the impedance ratio has a highest value with a thin LT plate similar to the above-discussed copper electrode thickness below the threshold value. However, the impedance ratio approximately flattens out at some LT thickness value (e.g., about 1λ), and generally remains approximately flat, as the LT thickness increases.

When a copper electrode thickness is significantly greater than the threshold value, the impedance ratio may or may not have a highest value with a thin LT plate (e.g., 0.1λ). For example, the impedance ratio curve 174 corresponding to a significantly larger copper electrode thickness of 0.25λ has an impedance ratio value at the thin LT plate thickness of 0.1λ that is about the same as the flattened out impedance ratio value at higher LT thickness values. It is noted that in such a configuration (where the copper electrode thickness is significantly greater than the threshold value), the impedance ratio also has an approximately flat response beyond some LT thickness value (e.g., about 1λ).

In the foregoing trends of impedance ratio of the curves 172 and 174, a thicker range (e.g., greater than about 2λ) of LT plate provides acceptable performance of the corresponding SAW resonator in terms of acceptable ripples and spurious responses, and a thinner range (e.g., 0.1λ to 2λ) of the LT plate results in ripples and/or spurious responses so as to make the corresponding SAW resonator impractical for many applications. In the latter configuration, one can consider the LT plate to be too thin for the corresponding copper electrode thickness.

Based on the foregoing description of the examples of FIG. 20, one can see that depending on the thickness of a given LT plate, an electrode thickness can be selected or tuned to provide desired performance in the corresponding SAW resonator. For example, if an LT plate is thinner than some thickness value, a thinner electrode (e.g., thickness less than a threshold electrode thickness value) can be provided such that the corresponding SAW resonator has an acceptable performance. In another example, if an LT plate is thicker than some thickness value, a thicker electrode (e.g., thickness greater than the threshold electrode thickness value) can be provided such that the corresponding SAW resonator has an acceptable performance.

Referring to FIG. 20, it is noted that for the copper electrode thickness range of 0.06λ to 0.079λ, higher impedance ratios of 70 to 78 dB can be obtained for the LT plate thickness in the range of 0.1λ to about 1.3λ, and slightly lower impedance ratios of 68 to 70 dB can be obtained at the LT plate thickness range of 1.3λ to about 2λ, with little or no ripple or spurious response similar to the example of FIG. 12. For the copper electrode thickness range of 0.08λ to 0.25λ, impedance ratios of 71 to 73 dB (e.g., 72 to 73 dB for the copper electrode thickness of 0.08λ, and 71 dB for the copper electrode thickness of 0.25λ) can be obtained for the LT plate thickness in the range of about 2λ to about 200λ, with sufficiently small spurious responses (similar to the example of FIG. 18) so as to make the corresponding SAW resonator usable in many applications.

In the various examples described herein in reference to FIGS. 12-20, the electrodes are copper electrodes having various thicknesses. Assuming that such electrodes have similar layout dimensions, a thicker copper electrode has more mass than a thinner electrode. Accordingly, an electrode having an increased mass can be utilized to provide a desired performance for a SAW resonator having an increased thickness of an LT plate.

Figure 21:
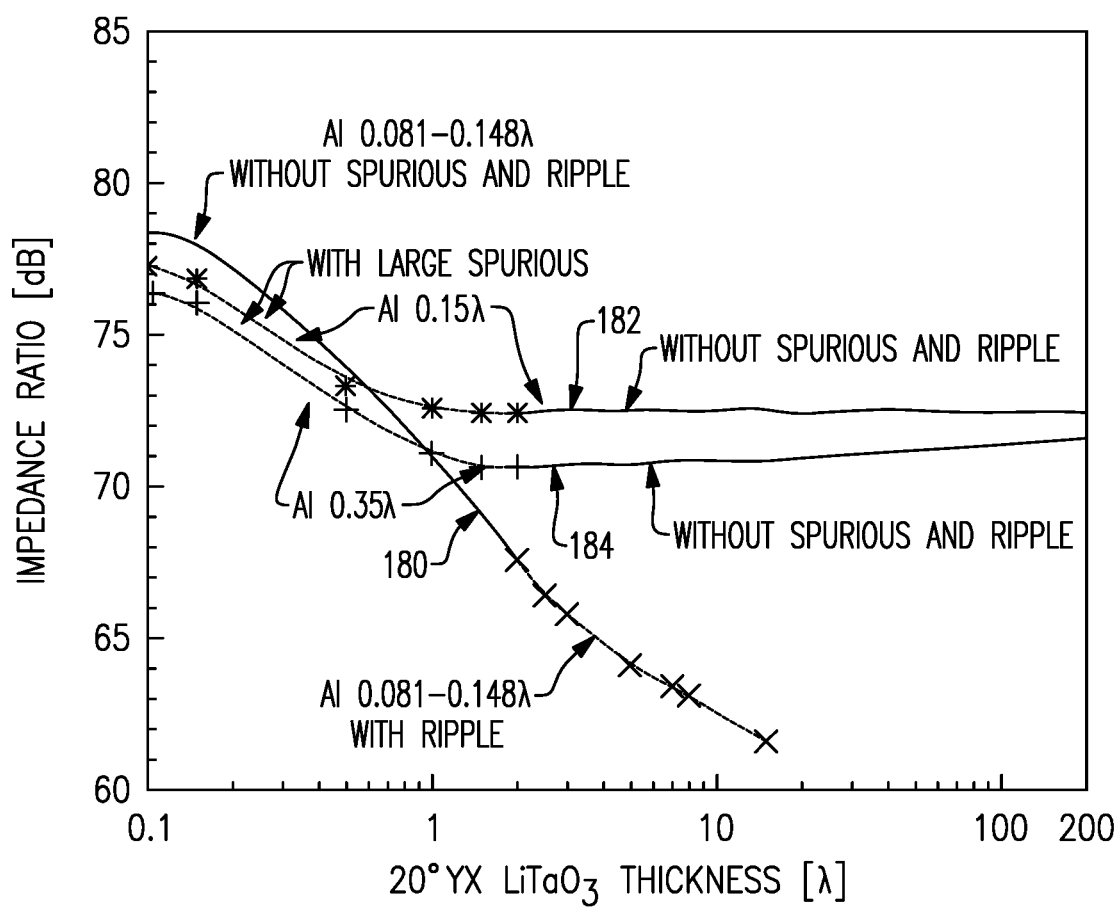
FIG. 21 shows impedance ratio plots as a function of LT plate thickness, for different aluminum (Al) electrode thicknesses.

It is noted that copper is an example material that can be utilized as an electrode for a SAW resonator. Other electrically conductive materials such as metals and/or alloys can also be utilized as SAW resonator electrodes. For example, FIG. 21 shows a summary of impedance ratio plots as a function of LT plate thickness, for different aluminum (Al) electrode thicknesses. More particularly, curve 180 is for a SAW resonator having an aluminum electrode with a thickness $T_{electrode}$ in a range of 0.081λ to 0.148λ; curve 182 is for a SAW resonator having an aluminum electrode with a thickness $T_{electrode}$ of 0.15λ; and curve 184 is for a SAW resonator having an aluminum electrode with a thickness $T_{electrode}$ of 0.35λ.

For each of the three curves (180, 182 or 184) of FIG. 21, the solid-line portion corresponds to impedance ratio responses that are without (or sufficiently low amplitude) ripples or spurious responses (as a function of frequency) to make the corresponding SAW resonator practical for many applications, and the dashed-line portion corresponds to impedance ratio responses having either or both of ripples and spurious responses (as a function of frequency) to make the corresponding SAW resonator impractical for many applications.

A number of observations can be made from the impedance ratio plots of FIG. 21. First, it is noted that for an aluminum electrode thickness up to some value (e.g., at or around a value of 0.148λ), impedance ratio is highest with a thin LT plate (e.g., 0.1λ), and decreases generally monotonically as the LT plate thickness increases. In such a decreasing trend of impedance ratio, a range (e.g., 0.1λ to about 2λ) of LT plate provides acceptable performance of the corresponding SAW resonator, and a thicker range (e.g., greater than 2λ) of the LT plate results in high ripples and/or spurious responses so as to make the corresponding SAW resonator impractical for many applications. In the latter configuration, one can consider the LT plate to be too thick for the corresponding aluminum electrode thickness.

Second, it is noted that for an aluminum electrode thickness greater than the above-discussed value (e.g., at or around a value of 0.148λ), impedance ratio may or may not be the highest with a thin LT plate (e.g., 0.1λ), and eventually reaches an approximately flat impedance ratio as the LT plate thickness increases. For the purpose of description, an aluminum electrode thickness value (e.g., at or around a value of 0.148λ) can be considered to be a threshold thickness value.

When an aluminum electrode thickness is greater than, but close to, the threshold value, the impedance ratio has a highest value with a thin LT plate similar to the above-discussed aluminum electrode thickness below the threshold value. However, the impedance ratio approximately flattens out at some LT thickness value (e.g., about 1λ), and generally remains approximately flat, as the LT thickness increases. Each of the impedance ratio curves 182, 184 is an example of such an impedance ratio profile.

When an aluminum electrode thickness is significantly greater than the threshold value, the impedance ratio may or may not have a highest value with a thin LT plate (e.g., 0.1λ). For example, if an aluminum electrode has a thickness that is significantly greater than 0.35λ (of the curve 184), a corresponding impedance ratio curve likely has an impedance ratio value at the thin LT plate thickness of 0λ that is about the same as the flattened out impedance ratio value at higher LT thickness values.

In the foregoing examples of impedance ratio of the curves 182 and 184, a thicker range (e.g., greater than about 2λ) of LT plate provides acceptable performance of the corresponding SAW resonator in terms of acceptable ripples and spurious responses, and a thinner range (e.g., 0λ to 2λ) of the LT plate results in ripples and/or spurious responses so as to make the corresponding SAW resonator impractical for many applications. In the latter configuration, one can consider the LT plate to be too thin for the corresponding aluminum electrode thickness.

Referring to FIG. 21, it is noted that for the aluminum electrode thickness range of 0.081λ to 0.148λ, higher impedance ratios of 70 to 78.5 dB can be obtained for the LT plate thickness in the range of 0λ to about 1.3λ, and slightly lower impedance ratios of 67.5 to 70 dB can be obtained at the LT plate thickness range of 1.3λ to about 2λ, with little or no ripple or spurious response. For the aluminum electrode thickness range of 0.15λ to 0.35λ, larger out-of-band spurious responses are observed for LT plate thickness in a range of 0λ to about 2λ; however, for LT plate thickness in a range of 2λ to 200λ, impedance ratios of 71 to 72 dB can be obtained with sufficiently small spurious responses so as to make the corresponding SAW resonator usable in many applications. It is noted that such a range of impedance ratios (71 to 72 dB) are greater by about 6 to 8 dB than the impedance ratio of about 65 dB obtained by a common SAW resonator having a thin aluminum electrode.

In another example, an electrode formed from gold (Au) having a thickness $T_{electrode}$ in a range of 0.02λ to 0.036λ can provide impedance ratios of 68 to 78 dB, for an LT plate thickness in a range of 0λ to 2λ, with little or no ripple or spurious response to make the corresponding SAW resonator practical for many applications. For such an electrode thickness, when the LT plate is thicker, either or both of ripples and spurious responses are present so as to make the corresponding SAW resonator impractical for many applications.

On the other hand, for a gold electrode having a thickness $T_{electrode}$ in a range of 0.037λ to 0.12λ, impedance ratios of 70 dB or greater can be obtained with little or no ripple and with small spurious responses to make the corresponding SAW resonator practical for many applications, for an LT plate thickness greater than 2λ (e.g., 2λ to 200λ). For such an electrode thickness, when the LT plate is thinner, either or both of ripples and spurious responses are present so as to make the corresponding SAW resonator impractical for many applications.

Based on the foregoing description of the examples of FIGS. 20 and 21 and the gold electrode configuration, one can see that depending on the thickness of a given LT plate, an electrode's mass can be selected or tuned to provide desired performance in the corresponding SAW resonator. Such a mass can be selected based on, for example, density of the electrode and/or dimensions of the electrode. In some embodiments, density of an electrode can be selected based on the material of the electrode. In some embodiments, dimensions of an electrode can be selected based on the thickness of the electrode.

Figure 22:
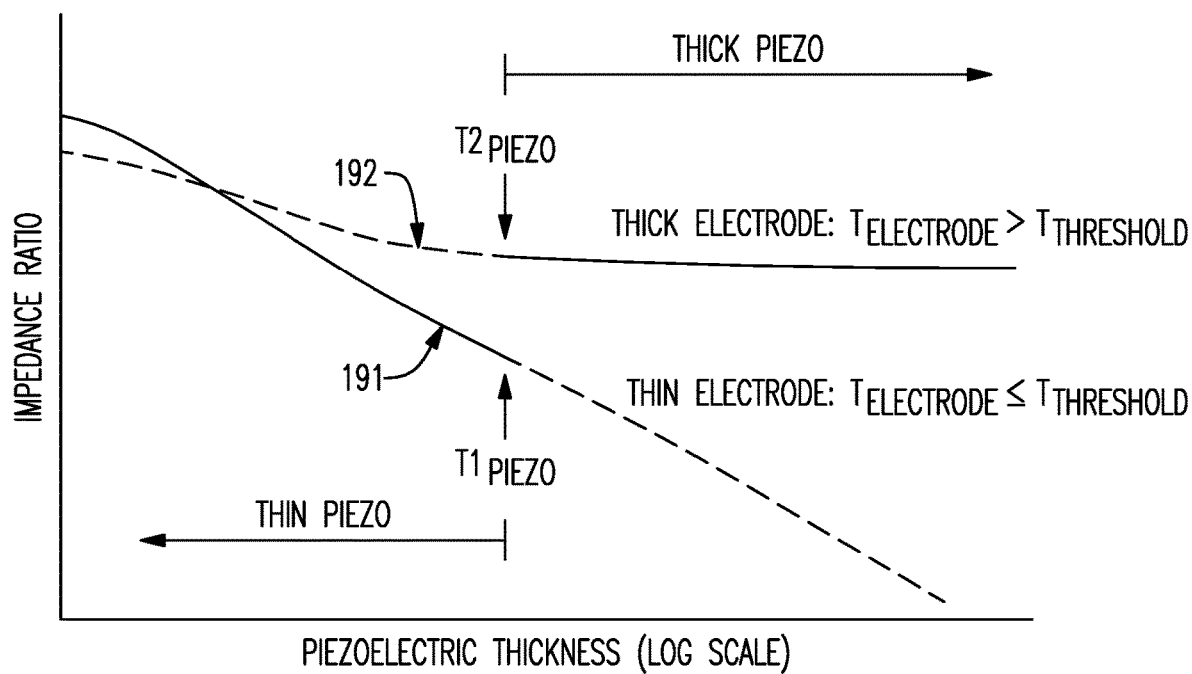
FIG. 22 shows impedance ratio plots as a function of piezoelectric thickness for a SAW resonator with a more generalized combination of a piezoelectric plate and an electrode implemented thereon.

FIG. 22 shows impedance ratio plots (as a function of piezoelectric thickness) for a SAW resonator with a more generalized combination of a piezoelectric plate (e.g., LT or LN plate) and an electrode (e.g., metal electrode) implemented thereon. More particularly, an impedance ratio curve 191 is for an electrode having a thickness $T_{electrode}$ that is less than or equal to a thickness threshold value $T_{threshold}$, and an impedance ratio curve 192 is for an electrode having a thickness $T_{electrode}$ that is greater than the thickness threshold value $T_{threshold}$. Examples of such a thickness threshold value $T_{threshold}$ are described herein in greater detail.

Similar the examples of FIGS. 20 and 21, in the example of FIG. 22, the solid-line portion of each of the curves 191, 192 corresponds to impedance ratio responses that are without (or sufficiently low amplitude) ripples or spurious responses to make the corresponding SAW resonator practical for many applications, and the dashed-line portion corresponds to impedance ratio responses having either or both of ripples and spurious responses to make the corresponding SAW resonator impractical for many applications.

As seen in the examples of FIGS. 20 and 21 and the gold electrode configuration, and also referring to FIG. 22, there is a thickness value $T_{threshold}$ such that an electrode thinner than or equal to $T_{threshold}$ (as in the curve 191) results in the corresponding SAW resonator to provide a solid-line performance (without (or sufficiently low amplitude) ripples or spurious responses) for a thin piezoelectric (also referred to herein as a piezo) having a thickness less than or equal to $T1_{piezo}$, and a dashed-line performance (either or both of ripples and spurious responses) for a thick piezoelectric having a thickness less than $T1_{piezo}$. Further, an electrode thicker than $T_{threshold}$ (as in the curve 192) results in the corresponding SAW resonator to provide a solid-line performance (without (or sufficiently low amplitude) ripples or spurious responses) for a thick piezoelectric having a thickness greater than $T2_{piezo}$, and a dashed-line performance (either or both of ripples and spurious responses) for a thin piezoelectric having a thickness less than or equal to $T2_{piezo}$.

It is noted that the thickness values $T1_{piezo}$ and $T2_{piezo}$ may or may not be the same; however for the purpose of description of some specific examples, such values are assumed to be approximately the same. Table 1 lists such piezoelectric thickness values $T_{piezo} \approx T1_{piezo} \approx T2_{piezo}$, as well as electrode $T_{threshold}$ values, for the examples associated with copper, aluminum and gold electrodes.

TABLE 1

| Electrode material | Piezoelectric material | $T_{piezo} \approx T1_{piezo} \approx T2_{piezo}$ | $T_{threshold}$ |
|---|---|---|---|
| Copper (Cu) | LT | 2λ | 0.079λ |
| Aluminum (Al) | LT | 2λ | 0.148λ |
| Gold (Au) | LT | 2λ | 0.036λ |

In the examples of Table 1, the piezoelectric material is LT, and the corresponding values of $T_{piezo}$ for such LT material, as well as $T_{threshold}$ values of different metal electrodes are listed. It will be understood that values for $T_{piezo}$ and $T_{threshold}$ can be obtained for other piezoelectric materials, including LN material. It will also be understood that $T_{piezo}$ may or may not be material-dependent, and $T_{threshold}$ may or may not be material-dependent. For example, for SAW resonators utilizing LN plates, the thickness value $T_{piezo}$ may or may not be similar to the thickness value associated with LT plates. Also, for such LN plate based SAW resonators, $T_{threshold}$ values of different metal electrodes may or may not be similar to those associated with LT plate based SAW resonators.

In some embodiments, for the purpose of description, a piezoelectric layer (also referred to herein as a piezoelectric plate, a piezoelectric film, or simply a piezoelectric or piezo) can be considered to be a thin piezoelectric layer if its thickness is less than or equal to $T_{piezo}$, and a thick piezoelectric layer if its thickness is greater than $T_{piezo}$. Also for the purpose of description, an electrode corresponding to the foregoing piezoelectric layer can be considered a thin electrode if its thickness is less than or equal to $T_{threshold}$, and a thick electrode if its thickness is greater than $T_{threshold}$.

As described herein, an electrode for a SAW resonator can be formed from a number of electrically conductive materials, including metals such as copper, aluminum and gold. It will be understood that other electrically conductive materials, including other metals, alloys, etc. can also be utilized as electrodes for SAW resonators having one or more features as described herein. Table 2 lists non-limiting examples of metals that can be utilized as such electrodes.

TABLE 2

| Metal | Density (g/cm³) |
| --- | --- |
| Magnesium (Mg) | 1.74 |
| Aluminum (Al) | 2.60 |
| Titanium (Ti) | 4.51 |
| Nickel (Ni) | 8.90 |
| Copper (Cu) | 8.96 |
| Molybdenum (Mo) | 10.2 |
| Silver (Ag) | 10.5 |
| Hafnium (Hf) | 13.3 |
| Tantalum (Ta) | 16.4 |
| Tungsten (W) | 19.25 |
| Gold (Au) | 19.30 |
| Platinum (Pt) | 21.5 |

Figure 23:
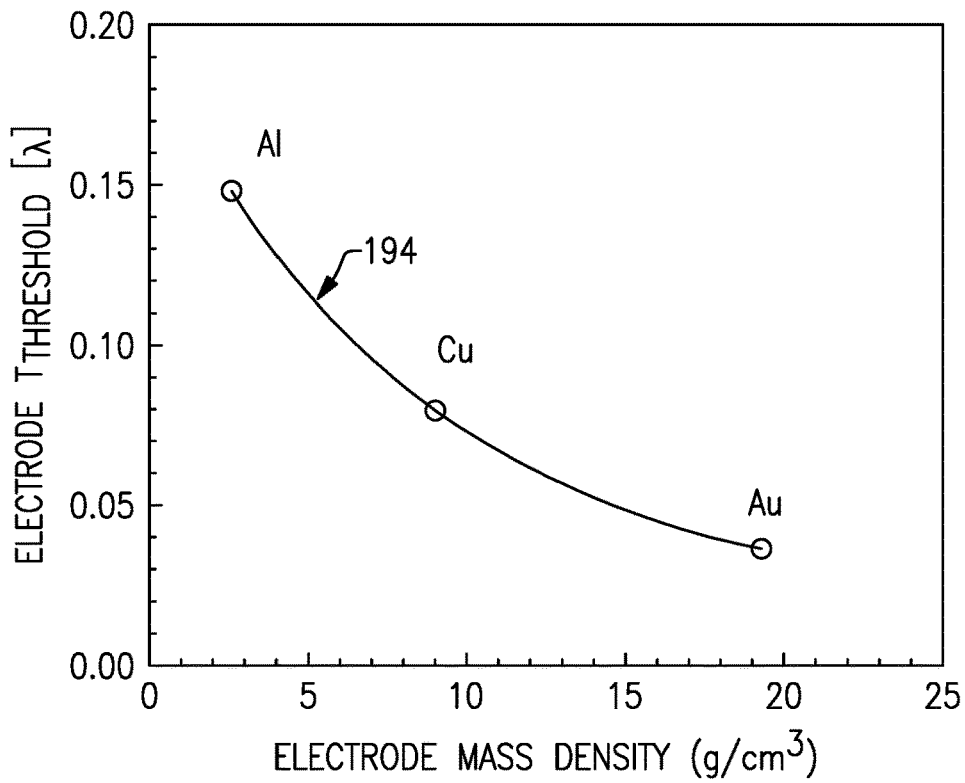
FIG. 23 depicts an example of a relationship between thickness threshold value of an electrode and density of the electrode material including aluminum, copper and gold.

As described herein in reference to FIGS. 20-22 and Table 1, thickness threshold value $T_{threshold}$ of an electrode decreases as density of the electrode material increases. FIG. 23 depicts such a relationship for the aluminum, copper and gold examples. It is noted that such data points may be parts of a curve 194 representative of electrode thickness threshold value $T_{threshold}$ as a function of mass density of the electrode material. Such a curve, and/or a set of data points representative of such a curve, may be obtained by, for example, empirical measurements, calculation, extrapolation, interpolation, modelling, etc. It is also noted that such a curve, and/or a set of data points representative of such a curve, may be obtained for one or more piezoelectric materials. For example, one set of $T_{threshold}$ values may be obtained and be applicable for both of LT and LN materials. In another example, a first set of $T_{threshold}$ values may be utilized for LT material, and a second set of $T_{threshold}$ values may be utilized for LN material.

Figure 24:
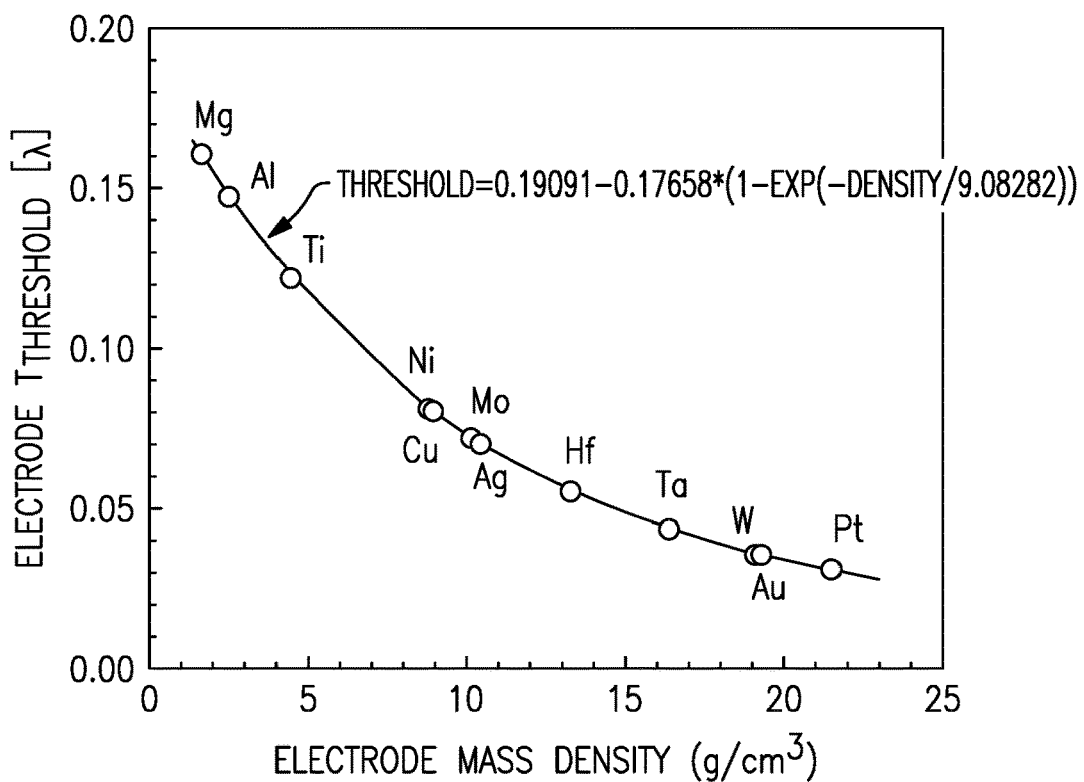
FIG. 24 depicts another example of a relationship between thickness threshold value of an electrode and density of the electrode material including a number of materials.

FIG. 24 shows electrode thickness threshold values $T_{threshold}$ as circles, for the electrode materials listed in Table 2. In some embodiments, such $T_{threshold}$ values can be represented by a curve (194 in FIG. 23) according to Equation 1.

$$T_{threshold} = \left(\frac{0.5}{MR}\right)\left[a - b(1 - e^{-\rho/c})\right]. \tag{1}$$

In Equation 1, $T_{threshold}$ is in terms of the wavelength $\lambda$ associated with the electrode, $\rho$ is the mass density (in g/cm³) of the electrode material, and MR is the metallization ratio of the electrode as described herein (MR=F/(F+G)). For the example of FIG. 24 and Table 2, the parameters a, b and c have the following approximate values: a≈0.19091, b≈0.17658, and c≈9.08282, with a and b being in terms of λ, and c being in terms of mass density ρ.

It is noted that if the metallization ratio MR of a given electrode is 0.5 (as in the various examples associated with FIGS. 12-21), the $T_{threshold}$ expression of Equation 1 can be reduced to Equation 2.

$$T_{threshold} = a - b(1 - e^{-\rho/c}), \tag{2}$$

with the parameters a, b, c and ρ being as described above in reference to Equation 1.

In some embodiments, $T_{threshold}$ can be calculated according to Equation 1 or Equation 2 with one or more variations from the foregoing specific example values of the parameters a, b and c. For example, if the foregoing example value of a is considered to be $a_0$=0.19091, the parameter a can have a value of $a=a_0+0.10a_0$, $a=a_0\pm0.09a_0$, $a=a_0\pm0.08a_0$, $a=a_0\pm0.07a_0$, $a=a_0\pm0.06a_0$, $a=a_0+0.05a_0$, $a=a_0\pm0.04a_0$, $a=a_0\pm0.03a_0$, $a=a_0\pm0.02a_0$, or $a=a_0\pm0.01a_0$. Similarly, if the foregoing example value of b is considered to be $b_0$=0.17658, the parameter b can have a value of $b=b_0\pm0.10b_0$, $b=b_0\pm0.09b_0$, $b=b_0\pm0.08b_0$, $b=b_0\pm0.07b_0$, $b=b_0+0.06b_0$, $b=b_0\pm0.05b_0$, $b=b_0\pm0.04b_0$, $b=b_0\pm0.03b_0$, $b=b_0\pm0.02b_0$, or $b=b_0$ $0.01b_0$. Similarly, if the foregoing example value of c is considered to be $c_0$=9.08282, the parameter c can have a value of $c=c_0\pm0.10c_0$, $c=c_0\pm0.09c_0$, $c=c_0\pm0.08c_0$, $c=c_0\pm0.07c_0$, $c=c_0\pm0.06c_0$, $c=c_0\pm0.05c_0$, $c=c_0\pm0.04c_0$, $c=c_0\pm0.03c_0$, $c=c_0$ $0.02c_0$, or $c=c_0\pm0.01c_0$.

In some embodiments, if the $T_{threshold}$ curve of Equation 1 or Equation 2 is considered to be $T^0_{threshold}$ when using the specific example values of $a_0$=0.19091, $b_0$=0.17658, and $c_0$=9.08282, a $T_{threshold}$ curve can vary for designing a thickness of an electrode. For example, a $T_{threshold}$ curve can vary in a range according to $T_{threshold}=T^0_{threshold}\pm0.10T^0_{threshold}$, $T_{threshold}=T^0_{threshold}\pm0.09T^0_{threshold}$, $T_{threshold}=T^0_{threshold}+0.08T^0_{threshold}$, $T_{threshold}=T^0_{threshold}\pm0.07T^0_{threshold}$, $T_{threshold}=T^0_{threshold}\pm0.06T^0_{threshold}$, $T_{threshold}=T^0_{threshold}\pm0.05T^0_{threshold}$, $T_{threshold}=T^0_{threshold}\pm0.04T^0_{threshold}$, $T_{threshold}=T^0_{threshold}\pm0.03T^0_{threshold}$, $T_{threshold}=T^0_{threshold}\pm0.02T^0_{threshold}$, or $T_{threshold}=T^0_{threshold}+0.01T^0_{threshold}$.

As described herein, by using an electrode thicker than the $T_{threshold}$ value, good or acceptable frequency characteristic performance can be obtained for a SAW resonator having a piezoelectric plate thicker than, for example, 2λ. If a material is listed in Table 2, the corresponding $T_{threshold}$ value can be utilized to design an electrode having a thickness, for example, greater than $T_{threshold}$. If a material is not listed in Table 2, the corresponding $T_{threshold}$ value can be calculated according to Equation 1 or Equation 2, and such a threshold value can be utilized to design an electrode having a thickness, for example, greater than $T_{threshold}$.

In some embodiments, an electrode having one or more features as described herein can be formed as an alloy of a plurality of elements such as plurality of metal elements. For such an electrode, $T_{threshold}$ value can be calculated according to Equation 1 or Equation 2, using an average density of the alloy as the mass density ρ. Such a threshold value can be utilized to design an electrode having a thickness, for example, greater than $T_{threshold}$.

In some embodiments, an electrode having one or more features as described herein can be formed to include a plurality of layers (e.g., a plurality of different materials). For such an electrode, $T_{threshold}$ value can be calculated according to Equation 1 or Equation 2, using an average density of the plurality of layers as the mass density ρ. Such a threshold value can be utilized to design an electrode having a thickness, for example, greater than $T_{threshold}$.

Referring to FIGS. 23 and 24, in some embodiments, for a given electrode material, an electrode can be considered a thin electrode if its thickness is less than or equal to a corresponding $T_{threshold}$ value, and a thick electrode if its thickness is greater than the corresponding $T_{threshold}$ value. For the purpose of description, such a $T_{threshold}$ value may be a value that is measured or calculated, or a value that is modelled, extrapolated or interpolated.

Accordingly, in the example of FIG. 23, the curve 194 and the region underneath the curve 194 can be considered to be representative of thin electrodes for respective mass density materials, and the region above the curve 194 can be considered to be representative of thick electrodes for respective mass density materials. Similarly, in the example of FIG. 24, the curve represented by Equation 1 or Equation 2 and the region underneath the curve can be considered to be representative of thin electrodes for respective mass density materials, and the region above the curve can be considered to be representative of thick electrodes for respective mass density materials.

In some embodiments, a piezoelectric layer (also referred to herein as a piezoelectric plate, a piezoelectric film, or simply a piezoelectric or piezo) can be considered to be a thick piezoelectric layer if its thickness is greater than $T_{piezo}$, greater than $1.01T_{piezo}$, greater than $1.02T_{piezo}$, greater than $1.03T_{piezo}$, greater than $1.04T_{piezo}$, greater than $1.05T_{piezo}$, greater than $1.10T_{piezo}$, greater than $1.20T_{piezo}$, greater than $1.30T_{piezo}$, greater than $1.40T_{piezo}$, greater than $1.50T_{piezo}$, or greater than $2T_{piezo}$.

In some embodiments, an electrode can be considered to be a thick electrode if its thickness is greater than $T_{threshold}$, greater than $1.01T_{threshold}$, greater than $1.02T_{threshold}$, greater than $1.03T_{threshold}$, greater than $1.04T_{threshold}$, greater than $1.05T_{threshold}$, greater than $1.10T_{threshold}$, greater than $1.20T_{threshold}$, greater than $1.30T_{threshold}$, greater than $1.40T_{threshold}$, greater than $1.50T_{threshold}$, or greater than $2T_{threshold}$.

Various specific examples provided herein are described in the context of some specific configurations of the respective SAW resonators. For example, various examples described in reference to FIGS. 12-21 are based on electrodes having a metallization ratio (MR) of 0.5, where MR=F/(F+G), with F being a width of an electrode finger and G being a gap dimension between two electrode fingers, as shown in FIG. 7.

Since at least the dimension F affects the size of an electrode and thus the mass of the electrode, in some embodiments, one or more features of the present disclosure can also be implemented based on the metal ratio (MR). For example, an electrode can be provided with a desirable mass (also referred to herein as mass-loaded) based on a relationship (MR)×$T_{electrode}$=(constant). In such a configuration, if mass ratio of an electrode is increased, then a reduced-thickness of the electrode can be utilized, even for a thick piezoelectric layer.

In another example, various electrode examples are described as being formed from materials such as metals and alloys. It will be understood that an electrode having one or more features of the present disclosure can be implemented in one or more layers utilizing one or more materials. If an electrode is formed in a plurality of layers with more than one material, an effective mass density (or an equivalent mass-related parameter) can be utilized based on individual mass densities of the materials.

In yet another example, various examples described in reference to FIGS. 12-21 are based on combinations of LT and quartz substrate. It will be understood that one or more features of the present disclosure can also be implemented utilizing other combinations of piezoelectric materials and substrates. For example, a combination of LN and quartz substrate can be utilized to obtain functionalities with a mass-loaded electrode, similar to the LT/quartz combination.

It is noted that in the examples of FIGS. 12-20 (LT/quartz combination with copper electrodes), electrodes are formed on a combination of (0°, 110°, 0°) LT/(0°, 132°45', 90°) quartz structure substrate, where (φ, θ, ψ) represents Euler angles. For the examples of FIG. 21 (LT/quartz combination with aluminum electrodes), electrodes are also formed on a combination of (0°, 110°, 0°) LT/(0°, 132° 45', 90°) quartz structure substrate. It will be understood that other structures of LT and/or quartz substrate can also be utilized. For example, orientation angles of (0–/+5°, 80 to 155°, 0–/+5°), (90–/+5°, 90–/+5°, 0 to 180°), and orientation angles equivalent thereof, may be utilized for LT to provide a desired electromechanical coupling property.

If LN is used instead of LT in combination with quartz, different orientation angles can be utilized. For example, orientation angles of (0–/+5°, 60 to 160°, 0–/+5°), (90–/+5°, 90–/+5°, 0 to 180°), and orientation angles equivalent thereof, may be utilized for LN to provide a desired electromechanical coupling property.

It is also noted that in some embodiments, orientation angles for the quartz substrate can be selected to not allow propagation direction of the SAW resonator to be oblique and power flow angle be approximately zero. For example, orientations such as the following can be utilized for the quartz substrate: (0+/–5°, θ, 35°+/–8°), (10°+/–±5°, θ, 42°+/–8°), (20°+/–5°, θ, 50°+/–8°), (0°+/–5°, θ, 0°+/–5°), (10°+/–5°, θ, 0°+/–5°), (20°+/–5°, θ, 0+/–5°), (0°+/–5°, θ, 90°+/–5°), (10°+/–5°, θ, 90°+/–5°), (20°+/–5°, θ, 90°+/–5°), and (90°+/–5°, 90°+/–5°, L), where each of θ and ψ has a value in a range 0° to 180°.

In some embodiments, a SAW resonator having one or more features as described herein can be implemented as a product, and such a product can be included in another product. Examples of such different products are described in reference to FIGS. 25-29.

Figure 25:
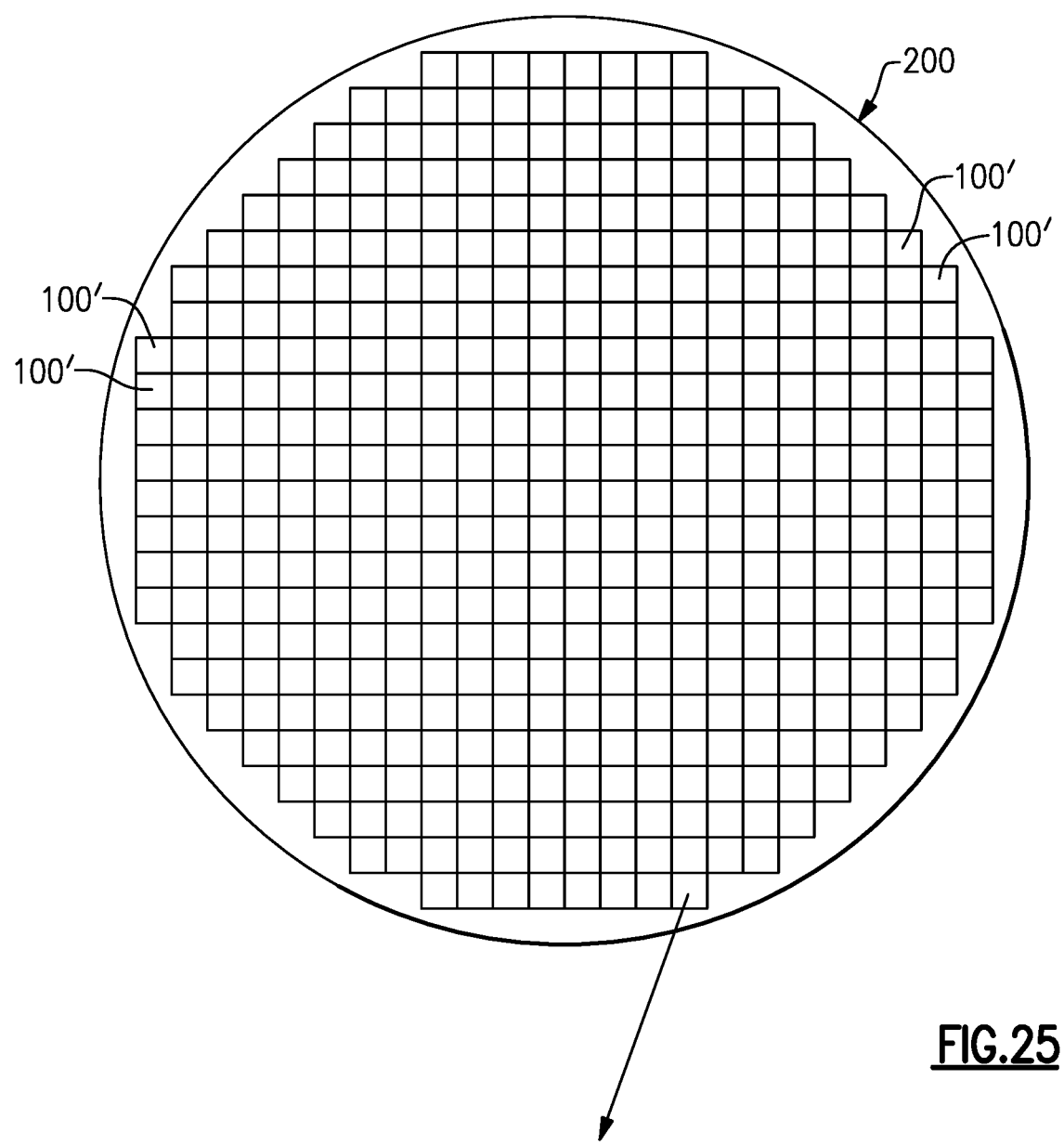
FIG. 25 shows that in some embodiments, multiple units of SAW resonators can be fabricated while in an array form.
Figure 25:
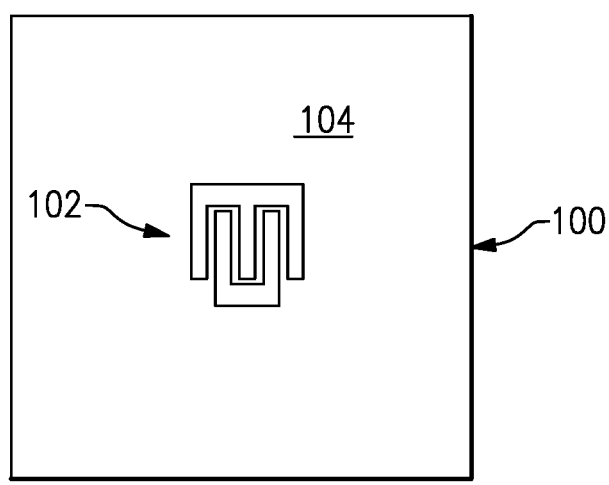

FIG. 25 shows that in some embodiments, multiple units of SAW resonators can be fabricated while in an array form. For example, a wafer 200 can include an array of units 100', and such units can be processed through a number of process steps while joined together. For example, in some embodiments, all of the process steps of FIGS. 8A-8C can be achieved while an array of such units are joined together as a wafer having different layers (e.g., quartz layer 112 and LT layer 130, 134). In another example, all of the process steps of FIGS. 9A-9E can be achieved while an array of such units are joined together as a wafer having different layers (e.g., handle layer 140, LT layer 130, 144 and quartz layer 112).

Upon completion of process steps in the foregoing wafer format, the array of units 100' can be singulated to provide multiple SAW resonators 100. FIG. 25 depicts one of such SAW resonators 100. In the example of FIG. 25, the singulated SAW resonator 100 is shown to include an electrode 102 formed on a piezoelectric layer 104 such as an LT layer. Such electrode and piezoelectric layer can be configured as described herein to provide desirable features. It will be understood that in some embodiments, another electrode can be provided, as well as one or more reflectors, on the piezoelectric layer.

Figure 26:
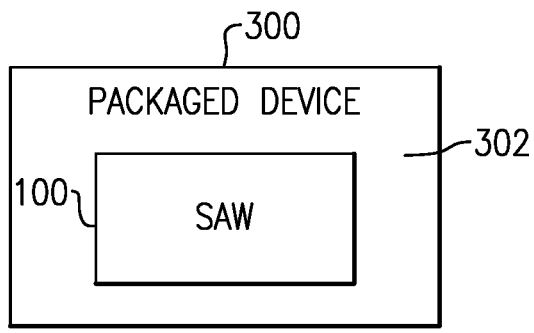
FIG. 26 shows that in some embodiments, a SAW resonator having or more features as described herein can be implemented as a part of a package device.

FIG. 26 shows that in some embodiments, a SAW resonator 100 having or more features as described herein can be implemented as a part of a package device 300. Such a packaged device can include a packaging substrate 302 configured to receive and support one or more components, including the SAW resonator 100.

Figure 27:
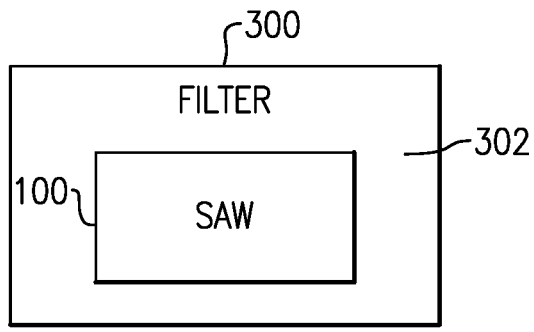
FIG. 27 shows that in some embodiments, the SAW resonator based packaged device of FIG. 26 can be a packaged filter device.

FIG. 27 shows that in some embodiments, the SAW resonator based packaged device 300 of FIG. 26 can be a packaged filter device 300. Such a filter device can include a packaging substrate 302 suitable for receiving and supporting a SAW resonator 100 configured to provide a filtering functionality such as RF filtering functionality.

Figure 28:
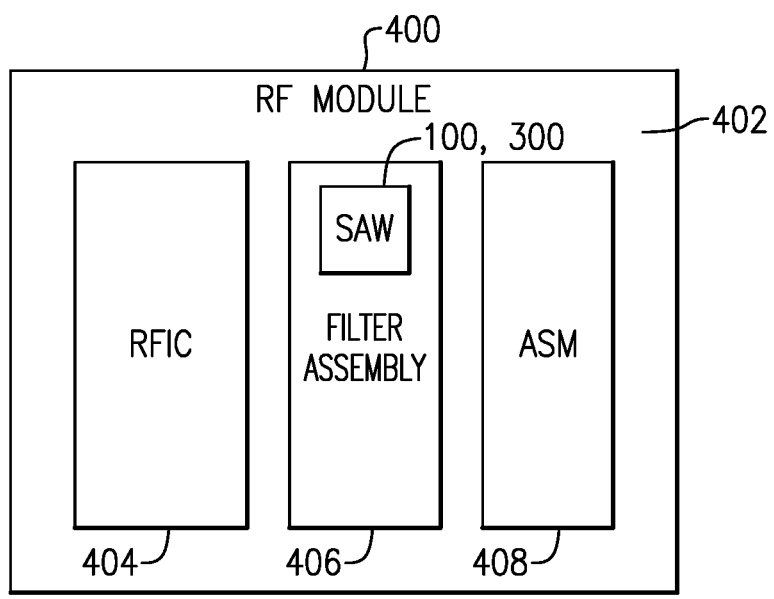
FIG. 28 shows that in some embodiments, a radiofrequency (RF) module can include an assembly of one or more RF filters.

FIG. 28 shows that in some embodiments, a radio-frequency (RF) module 400 can include an assembly 406 of one or more RF filters. Such filter(s) can be SAW resonator based filter(s) 100, packaged filter(s) 300, or some combination thereof. In some embodiments, the RF module 400 of FIG. 28 can also include, for example, an RF integrated circuit (RFIC) 404, and an antenna switch module (ASM) 408. Such a module can be, for example, a front-end module configured to support wireless operations. In some embodiments, some of all of the foregoing components can be mounted on and supported by a packaging substrate 402.

In some implementations, a device and/or a circuit having one or more features described herein can be included in an RF device such as a wireless device. Such a device and/or a circuit can be implemented directly in the wireless device, in a modular form as described herein, or in some combination thereof. In some embodiments, such a wireless device can include, for example, a cellular phone, a smart-phone, a hand-held wireless device with or without phone functionality, a wireless tablet, etc.

Figure 29:
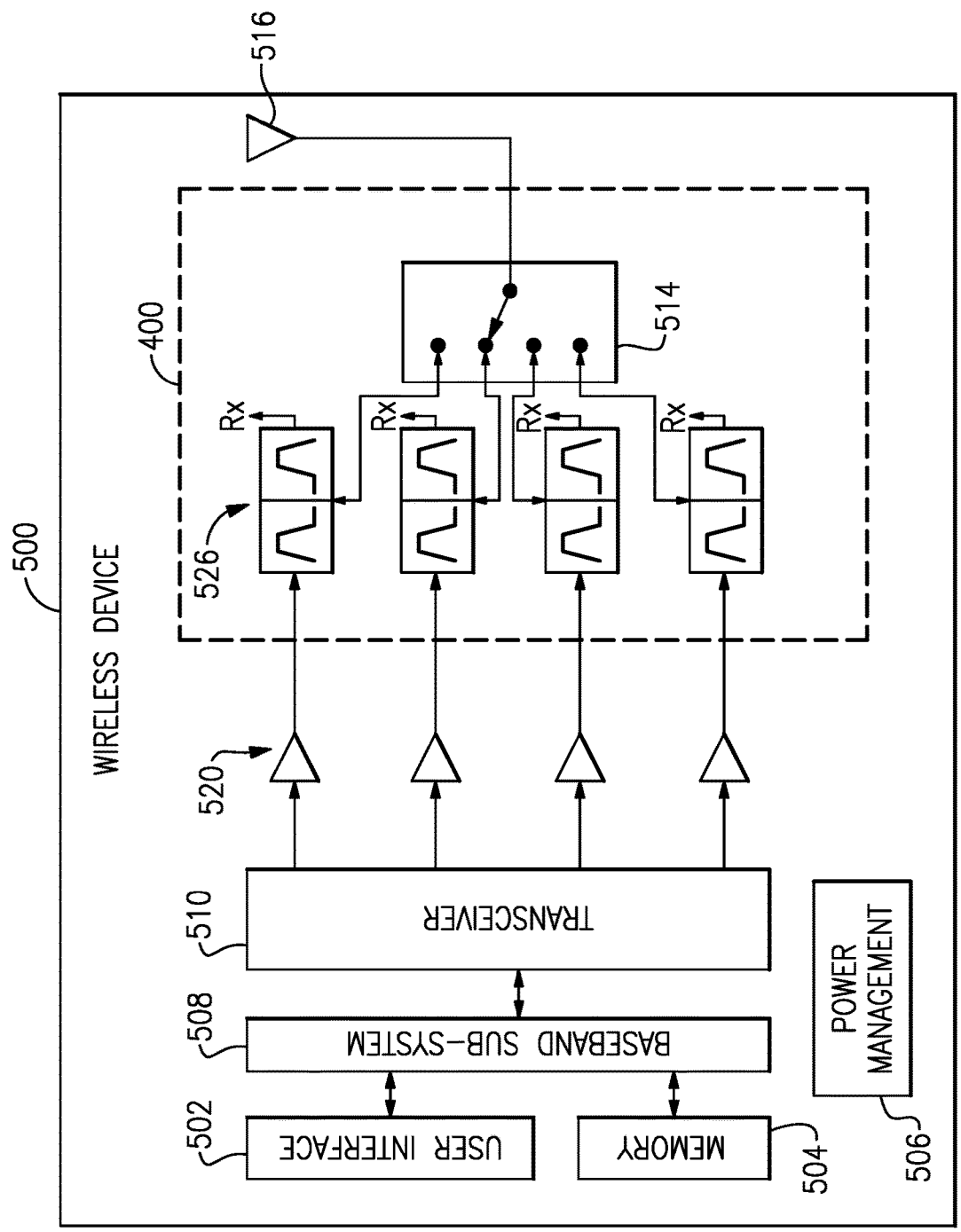
FIG. 29 depicts an example wireless device having one or more advantageous features described herein.

FIG. 29 depicts an example wireless device 500 having one or more advantageous features described herein. In the context of a module having one or more features as described herein, such a module can be generally depicted by a dashed $b_0 \times 400$, and can be implemented as, for example, a front-end module (FEM). In such an example, one or more SAW filters as described herein can be included in, for example, an assembly of filters such as duplexers 526.

Referring to FIG. 29, power amplifiers (PAs) 520 can receive their respective RF signals from a transceiver 510 that can be configured and operated in known manners to generate RF signals to be amplified and transmitted, and to process received signals. The transceiver 510 is shown to interact with a baseband sub-system 408 that is configured to provide conversion between data and/or voice signals suitable for a user and RF signals suitable for the transceiver 510. The transceiver 510 can also be in communication with a power management component 506 that is configured to manage power for the operation of the wireless device 500. Such power management can also control operations of the baseband sub-system 508 and the module 400.

The baseband sub-system 508 is shown to be connected to a user interface 502 to facilitate various input and output of voice and/or data provided to and received from the user. The baseband sub-system 508 can also be connected to a memory 504 that is configured to store data and/or instructions to facilitate the operation of the wireless device, and/or to provide storage of information for the user.

In the example wireless device 500, outputs of the PAs 520 are shown to be routed to their respective duplexers 526. Such amplified and filtered signals can be routed to an antenna 516 through an antenna switch 514 for transmission. In some embodiments, the duplexers 526 can allow transmit and receive operations to be performed simultaneously using a common antenna (e.g., 516). In FIG. 29, received signals are shown to be routed to "Rx" paths (not shown) that can include, for example, a low-noise amplifier (LNA).

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While some embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A surface acoustic wave device for providing resonance of a surface acoustic wave having a wavelength λ, comprising:
   a quartz substrate;
   a piezoelectric plate formed from LiTaO$_3$ or LiNbO$_3$ and disposed over the quartz substrate, the piezoelectric plate having a thickness greater than 2λ; and
   an interdigital transducer electrode formed over the piezoelectric plate, the interdigital transducer electrode having a mass density ρ in a range 1.50 g/cm$^3$<ρ≤6.00 g/cm$^3$, 6.00 g/cm$^3$<ρ≤12.0 g/cm$^3$, or 12.0 g/cm$^3$<ρ≤23.0 g/cm$^3$, and a thickness greater than 0.148λ, greater than 0.079λ, or greater than 0.036λ, respectively.

2. The surface acoustic wave device of claim 1 wherein the interdigital transducer electrode has a metallization ratio (MR) of approximately 0.5, where MR=F/(F+G), F being a width of an electrode finger and G being a gap dimension between two interdigitized neighboring fingers of the interdigital transducer electrode.

3. The surface acoustic wave device of claim 1 wherein the interdigital transducer electrode includes aluminum, titanium, magnesium, copper, nickel, silver, molybdenum, gold, platinum, tungsten, tantalum, hafnium, an alloy formed from a plurality of metals, or a structure having a plurality of layers, with a mass density range 1.50 g/cm$^3$<ρ≤23.0 g/cm$^3$.

4. The surface acoustic wave device of claim 1 wherein the piezoelectric plate is a LiTaO$_3$ (LT) plate.

5. The surface acoustic wave device of claim 4 wherein the LT plate is configured with Euler angles of (0–/+5°, 80 to 155°, 0–/+5°), (90–/+5°, 90°–/+5°, 0 to 180°).

6. The surface acoustic wave device of claim 1 wherein the piezoelectric plate is a LiNbO$_3$ (LN) plate.

7. The surface acoustic wave device of claim 6 wherein the LN plate is configured with Euler angles of (0–/+5°, 60 to 160°, 0–/+5°), (90–/+5°, 90°–/+5°, 0 to 180°).

8. The surface acoustic wave device of claim 1 wherein the quartz substrate is configured with Euler angles of (0+/−5°, θ, 35°+/−8°), (10°+/−±5°, θ, 42°+/−8°), (20°+/−5°, θ, 50°+/−8°), (0°+/−5°, θ, 0°+/−5°), (10°+/−5°, θ, 0°+/−5°), (20°+/−5°, θ, 0°+/−5°), (0°+/−5°, θ, 90°+/−5°), (10°+/−5°, θ, 90°+/−5°), (20°+/−5°, θ, 90°+/−5°), (90°+/−5°, 90°+/−5°, ψ), where each of θ and ψ has a value in a range 0° to 180°.

9. A method for manufacturing a surface acoustic wave device that provides resonance of a surface acoustic wave having a wavelength A, the method comprising:
   forming or providing a quartz substrate;
   implementing a piezoelectric plate formed from LiTaO$_3$ or LiNbO$_3$ to be over the quartz substrate, such that the piezoelectric plate has a thickness greater than 2λ; and
   forming an interdigital transducer electrode over the piezoelectric plate, such that the interdigital transducer electrode has a mass density ρ in a range 1.50 g/cm$^3$<ρ≤6.00 g/cm$^3$, 6.00 g/cm$^3$<ρ≤12.0 g/cm$^3$, or 12.0 g/cm$^3$<ρ≤23.0 g/cm$^3$, and a thickness greater than 0.148λ, greater than 0.079λ, or greater than 0.036λ, respectively.

10. The method of claim 9 wherein the implementing of the piezoelectric plate includes forming or providing an assembly of a thick piezoelectric plate and a quartz plate, the quartz plate providing the quartz substrate for the piezoelectric plate.

11. The method of claim 10 wherein the implementing of the piezoelectric plate further includes performing a thinning process on the thick piezoelectric plate to provide the piezoelectric plate with the thickness greater than 2λ, such that the piezoelectric plate includes a first surface that engages with the quartz plate and a second surface, opposite from the first surface, resulting from the thinning process.

12. The method of claim 9 wherein the implementing of the piezoelectric plate includes forming or providing an assembly of a thick piezoelectric plate and a handling substrate.

13. The method of claim 12 wherein the implementing of the piezoelectric plate further includes performing a thinning process on the thick piezoelectric plate to provide a thinned piezoelectric plate with a thickness greater than 2λ, such that the thinned piezoelectric plate includes a first surface resulting from the thinning process and a second surface, opposite from the first surface, that engages the handling substrate.

14. The method of claim 13 wherein the implementing of the piezoelectric plate further includes attaching a quartz plate to the first surface of the thinned piezoelectric plate such that the quartz plate provides the quartz substrate.

15. The method of claim 14 wherein the implementing of the piezoelectric plate further includes removing the handling substrate to expose the second surface of the thinned piezoelectric plate, and the thinned piezoelectric plate with the exposed second surface provides the piezoelectric plate.

16. A surface acoustic wave device for providing resonance of a surface acoustic wave having a wavelength A, comprising:
   a quartz substrate;
   a piezoelectric plate formed from LiTaO$_3$ or LiNbO$_3$ and disposed over the quartz substrate, the piezoelectric plate having a thickness greater than 2λ; and
   an interdigital transducer electrode formed over the piezoelectric plate, the interdigital transducer electrode having a mass density ρ and a thickness T greater than $$T_{threshold} = \left(\frac{0.5}{MR}\right)\left[a - b\left(1 - e^{-\rho/c}\right)\right],$$

MR being a metallization ratio of the interdigital transducer electrode, a having a value of 0.19091λ±δ$_a$, b having a value of 0.17658λ±δ$_b$, and c having a value of 9.08282 g/cm$^3$±δ$_c$.

17. The surface acoustic device of claim 16 wherein the metallization ratio (MR) has a value of approximately 0.5.

18. The surface acoustic device of claim 16 wherein δ$_a$ has a value of (0.10)0.19091λ, (0.09)0.19091λ, (0.08)0.19091λ, (0.07)0.19091λ, (0.06)0.19091λ, (0.05)0.19091λ, (0.04)0.19091λ, (0.03)0.19091λ, (0.02)0.19091λ, (0.01)0.19091λ, or less than (0.01)0.19091λ.

19. The surface acoustic device of claim 16 wherein δ$_b$ has a value of (0.10)0.17658λ, (0.09)0.17658λ, (0.08)0.17658λ, (0.07)0.17658λ, (0.06)0.17658λ, (0.05)0.17658λ, (0.04)0.17658λ, (0.03)0.17658λ, (0.02)0.17658λ, (0.01)0.17658λ, or less than (0.01)0.17658λ.

20. The surface acoustic device of claim 16 wherein δ$_c$ has a value of (0.10)9.08282 g/cm$^3$, (0.09)9.08282 g/cm$^3$, (0.08)9.08282 g/cm$^3$, (0.07)9.08282 g/cm$^3$, (0.06)9.08282 g/cm$^3$, (0.05)9.08282 g/cm$^3$, (0.04)9.08282 g/cm$^3$, (0.03)9.08282 g/cm$^3$, (0.02)9.08282 g/cm$^3$, (0.01)9.08282 g/cm$^3$, or less than (0.01)9.08282 g/cm$^3$.

* * * * *